(12) United States Patent
Staals et al.

(10) Patent No.: US 11,054,754 B2
(45) Date of Patent: Jul. 6, 2021

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Frank Staals, Eindhoven (NL); Anton Bernhard Van Oosten, Lommel (BE); Yasri Yudhistira, Cupertino, CA (US); Carlo Cornelis Maria Luijten, Duizel (NL); Bert Verstraeten, Lommel (BE); Jan-Willem Gemmink, Riethoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/626,690

(22) PCT Filed: May 28, 2018

(86) PCT No.: PCT/EP2018/063959
§ 371 (c)(1),
(2) Date: Dec. 26, 2019

(87) PCT Pub. No.: WO2019/001873
PCT Pub. Date: Jan. 3, 2019

(65) Prior Publication Data
US 2020/0142324 A1    May 7, 2020

(30) Foreign Application Priority Data
Jun. 26, 2017    (EP) .................................... 17177774

(51) Int. Cl.
*G03F 7/20*    (2006.01)

(52) U.S. Cl.
CPC ...... *G03F 7/70641* (2013.01); *G03F 7/70625* (2013.01); *G03F 7/70633* (2013.01); *G03F 7/70683* (2013.01)

(58) Field of Classification Search
CPC ............. G03F 7/70641; G03F 7/70625; G03F 7/70633; G03F 7/70683; G03F 1/22;
(Continued)

(56) References Cited

U.S. PATENT DOCUMENTS 6,433,878 B1 *   8/2002   Niu ..................... G03F 7/70441
                                                            356/392
8,786,833 B2     7/2014   Nikolsky et al.
(Continued)

FOREIGN PATENT DOCUMENTS

CN    101923285 A    12/2010
CN    104395830 A    3/2015
(Continued)

OTHER PUBLICATIONS

International Search Report and Written Opinion of the International Searching Authority directed to related International Patent Application No. PCT/EP2018/063959, dated Sep. 26, 2018; 11 pages.
(Continued)

*Primary Examiner* — Christina A Riddle
(74) *Attorney, Agent, or Firm* — Sterne, Kessler, Goldstein & Fox P.L.L.C.

(57) ABSTRACT

Focus metrology patterns and methods are disclosed which do not rely on sub-resolution features. Focus can be measured by measuring asymmetry of the printed pattern (T), or complementary pairs of printed patterns (TN/TM). Asymmetry can be measured by scatterometry. Patterns may be printed using EUV radiation or DUV radiation. A first type of focus metrology pattern comprises first features (422)
(Continued)

interleaved with second features (424) A minimum dimension (w1) of each first feature is close to a printing resolution. A maximum dimension (w2) of each second feature in the direction of periodicity is at least twice the minimum dimension of the first features. Each first feature is positioned between two adjacent second features such that a spacing (w1') and its nearest second feature is between one half and twice the minimum dimension of the first features. A second type of focus metrology pattern comprises features (1122, 1124) arranged in pairs.

17 Claims, 11 Drawing Sheets

(58) Field of Classification Search
CPC ..... G03F 1/38; G03F 1/42; G03F 1/44; G03F 7/7055; G03F 7/70616; G03F 7/70666; G03F 9/7023; G03F 9/7026; G03F 9/7073; G03F 9/7076; G03F 9/7084; H01L 23/544; H01L 2223/544
USPC ........ 355/52–55, 67–77; 430/5, 22, 30, 311, 430/322, 394; 250/492.1, 492.2, 492.22, 250/493.1, 548, 504 R
See application file for complete search history.

(56) References Cited

U.S. PATENT DOCUMENTS

| | | |
|---|---|---|
| 9,454,072 B2 | 9/2016 | Levinski et al. |
| 9,939,735 B2 | 4/2018 | Hinnen et al. |
| 2004/0190008 A1 | 9/2004 | Mieher et al. |
| 2006/0033921 A1 | 2/2006 | Den Boef et al. |
| 2009/0296058 A1* | 12/2009 | Slotboom ........... G03F 7/70516 355/53 |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2016/0033879 A1* | 2/2016 | Raghunathan ...... G03F 7/70641 355/55 |
| 2016/0274472 A1 | 9/2016 | Mathijssen et al. |
| 2016/0313646 A1 | 10/2016 | Dinger et al. |
| 2016/0313656 A1 | 10/2016 | Van Dommelen et al. |
| 2016/0334716 A1 | 11/2016 | Mieher |
| 2017/0176870 A1* | 6/2017 | Hinnen ............... G03F 7/70683 |

FOREIGN PATENT DOCUMENTS

| | | |
|---|---|---|
| WO | WO 2008/086827 A1 | 7/2008 |
| WO | WO 2013/178422 A1 | 12/2013 |

OTHER PUBLICATIONS

International Preliminary Report on Patentability directed to related International Patent Application No. PCT/EP2018/063959, dated Dec. 31, 2019; 8 pages.

European Search Report and Written Opinion directed to related European Patent Application No. 17177774.1, dated Apr. 19, 2018; 8 pages.

* cited by examiner (a)

(b)

METHODS AND PATTERNING DEVICES AND APPARATUSES FOR MEASURING FOCUS PERFORMANCE OF A LITHOGRAPHIC APPARATUS, DEVICE MANUFACTURING METHOD

CROSS-REFERENCE TO RELATED APPLICATIONS

This application claims priority of EP/U.S. application Ser. No. 17/177,774.1 which was filed on Jun. 26, 2017 and which is incorporated herein in its entirety by reference.

FIELD OF THE INVENTION

The present invention relates to inspection apparatus and methods usable, for example, to perform metrology in the manufacture of devices by lithographic techniques. The invention further relates to such methods for monitoring a focus parameter in a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features and/or grating structures with large pitches. Such structures may contravene design rules of the users of lithographic apparatuses. Asymmetry in a grating structure can be measured effectively using high-speed inspection apparatus such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For EUV lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology.

For these reasons, there is a need to develop new techniques for the measurement of focus performance in lithographic processes, particularly in EUV lithography, but also for projection-based lithography in general.

SUMMARY OF THE INVENTION

The present invention aims to provide alternative methods of measuring focus performance. In some aspects the invention aims to provide methods that are adaptable to new environments, such as EUV lithography. In some aspects, the invention aims to avoid the requirement for sub-resolution features to be defined in a patterning device.

In a first aspect of the invention, the inventors have recognized that alternative target designs can be devised, which provide focus-dependent asymmetry signals without the use of sub-resolution features.

The invention in a first aspect provides a method of measuring focus performance of a lithographic apparatus, the method comprising:

(a) using the lithographic apparatus to print at least one focus metrology pattern on a substrate, the printed focus metrology pattern comprising at least a first periodic array of features, (b) using inspection radiation to measure asymmetry between opposite portions of a diffraction spectrum for the first periodic array in the printed focus metrology pattern; and (c) deriving a measurement of focus performance based at least in part on the asymmetry measured in step (b), wherein said first periodic array comprises a repeating arrangement of first features interleaved with second features, a minimum dimension of each first feature being close to but not less than a resolution limit of the printing step (a), a maximum dimension of each second feature in the direction of periodicity being at least twice the minimum dimension of the first features;

wherein each first feature is positioned between two adjacent second features such that a spacing in the direction of periodicity between the first feature and its nearest second feature is between one half and twice the minimum dimension of the first features.

The invention in a second aspect provides a method of measuring focus performance of a lithographic apparatus, the method comprising:

(a) using the lithographic apparatus to print at least one focus metrology pattern on a substrate, the printed focus metrology pattern comprising an array of features that is periodic in at least one direction;

(b) measuring a property of the printed focus metrology pattern; and (c) deriving a measurement of focus performance from the measurement of said property, wherein the focus metrology pattern comprises at least a first periodic array of features, a dimension of each feature being close to but not less than a resolution limit of the printing step (a), wherein said features are arranged in pairs and a spacing between adjacent pairs of features within the focus metrology pattern in the direction of periodicity is much greater than both the dimension of each first feature and the spacing between first features within a pair.

The phrase "close to but not less than the resolution limit" should be interpreted as including dimensions that may be up to two times the resolution limit, or even 2½ times.

The measured property may be asymmetry. Asymmetry can be introduced to the feature pairs in different ways. This can be used to create focus metrology patterns whose asymmetry is sensitive to focus, without the need to violate design rules, or to include sub-resolution features.

In some embodiments the three-dimensional nature of interaction between the EUV radiation and a reflective type of patterning device leads to a focus sensitivity in the relative dimensions of a pair of fine features, even though such features are within the printing resolution of the lithographic apparatus. In such embodiments, the focus metrology pattern is defined by a patterning device and the printing in step (a) projects an image of the patterning device with patterning radiation incident on the patterning device at an oblique angle. In this way, a focus-dependent asymmetry can be introduced even while the patterns themselves are symmetrical.

Asymmetry can be measured in different ways. It may be measured by optical scatterometry, or it may be measured by electron microscopy, for example.

The invention yet further provides a patterning device for use in a lithographic apparatus, the patterning device comprising reflective and non-reflective portions to define features of one or more device patterns and one or more metrology patterns, the metrology patterns including at least one focus metrology pattern, adapted for use in a method according to the first aspect of the invention, as set forth above.

The invention yet further provides metrology apparatus for measuring a focus performance of a lithographic process, the metrology apparatus being operable to perform steps (b) and (c) of the method according to the first aspect or second aspect of the invention as set forth above.

The invention yet further provides a lithographic system comprising a lithographic apparatus comprising:

an illumination optical system arranged to illuminate a reflective patterning device;

a projection optical system arranged to project an image of the patterning device onto a substrate; and a metrology apparatus according to any aspect of the invention as set forth above, wherein the lithographic apparatus is arranged to use the measurement of focus performance derived by the metrology apparatus when applying the pattern to further substrates.

The invention yet further provides computer program products for use in implementing methods and apparatuses according to various aspects of the invention as set forth above.

The invention yet further provides a method of manufacturing devices using the method according to the first aspect or the second aspect of the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7(b) shows a complementary variants of the pattern;

FIGS. 12 (b) and (c) show simulations of the relationship between certain parameters of the focus metrology target and focus, illustrating one embodiment of the second aspect of the invention;

DETAILED DESCRIPTION OF EXEMPLARY EMBODIMENTS

Before describing embodiments of the invention in detail, it is instructive to present an example environment in which embodiments of the present invention may be implemented.

Figure 1:
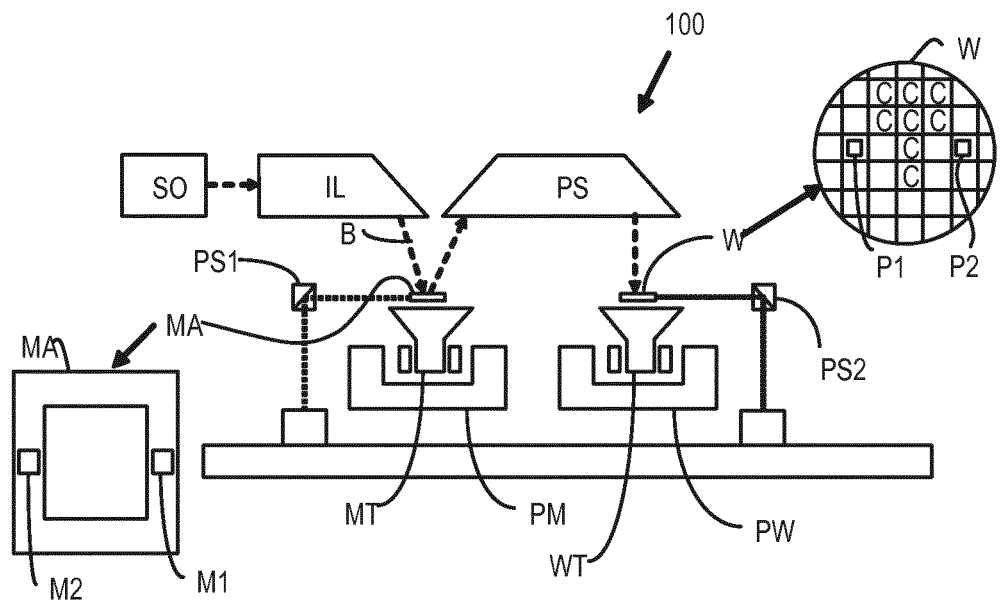
FIG. 1 depicts a lithographic apparatus having a reflective patterning device.

FIG. 1 schematically depicts a lithographic apparatus 100 including a source module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
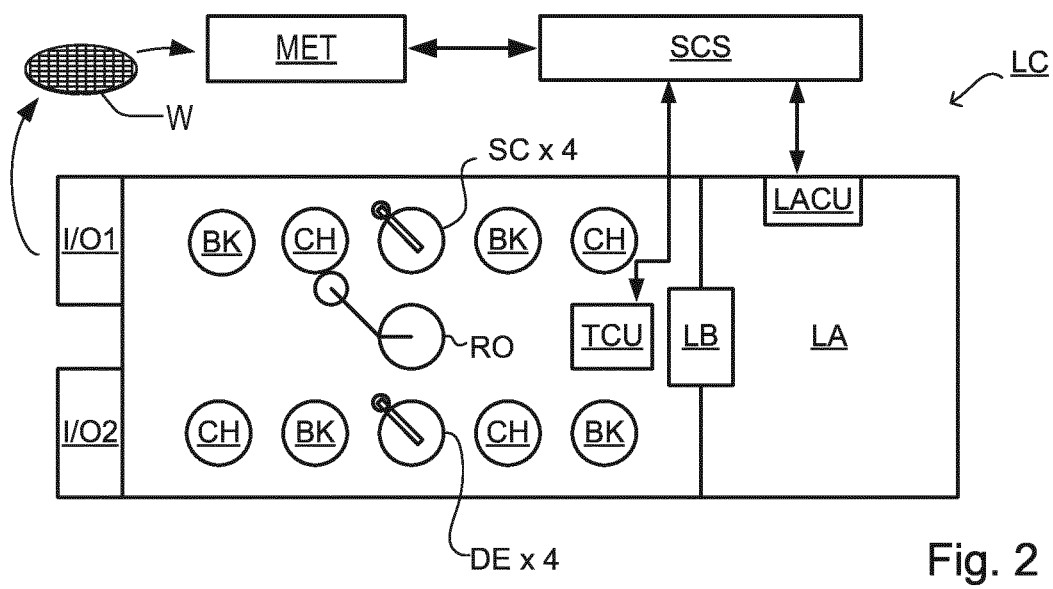
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line 0. A target grating structure T and diffracted rays are illustrated in more detail in FIG. 3(b).

As described in the prior applications cited in the introduction, the dark-field imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

Figure 3:
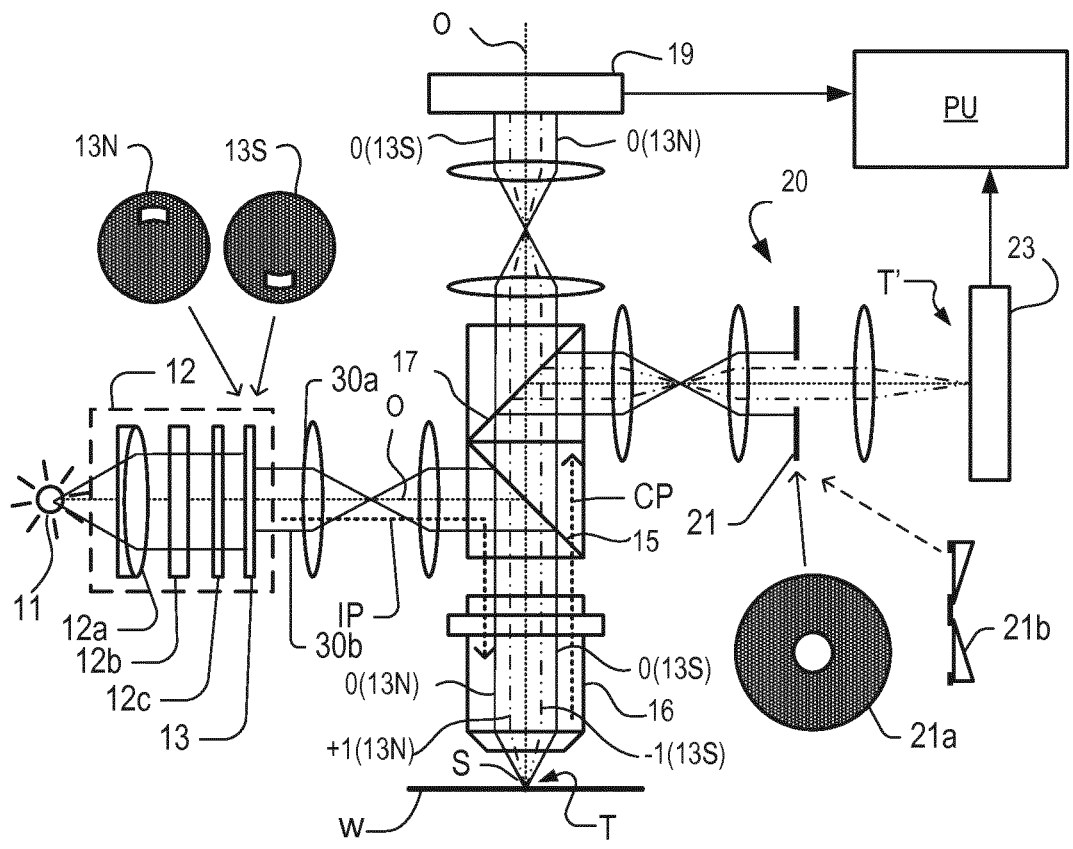
FIG. 3 illustrates schematically an inspection apparatus adapted to perform angle-resolved scatterometry and dark-field imaging inspection methods.

In the following disclosure, techniques will be illustrated for measuring focus performance of a lithographic process that uses oblique illumination on a reflective type of patterning device. These techniques may be applied in particular in EUV lithography, where reflective optics in a near-vacuum environment are required. Metrology targets including certain focus metrology patterns will be printed on the substrate, at the same time as product features are printed. Asymmetry in these printed patterns will be measured using for example diffraction based techniques in the apparatus of FIG. 3. To allow the use of small targets, it will be assumed that these asymmetry measurements will be performed using the dark-field imaging branch of the apparatus. Diffraction-based measurements of asymmetry can also be made using the pupil imaging branch, however. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, since the resolution of the imaging system is inherently higher in EUV lithography, features having dimensions below the printing resolution of DUV immersion lithography become "solid" features printable by EUV lithography. To provide analogous sub-resolution features on an EUV reticle is rather impractical, and/or may violate semiconductor manufacturer's "design rules". Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error. The desire to conform to design rules applies to DBF targets in DUV lithography, not only EUV lithography.

Figure 4:
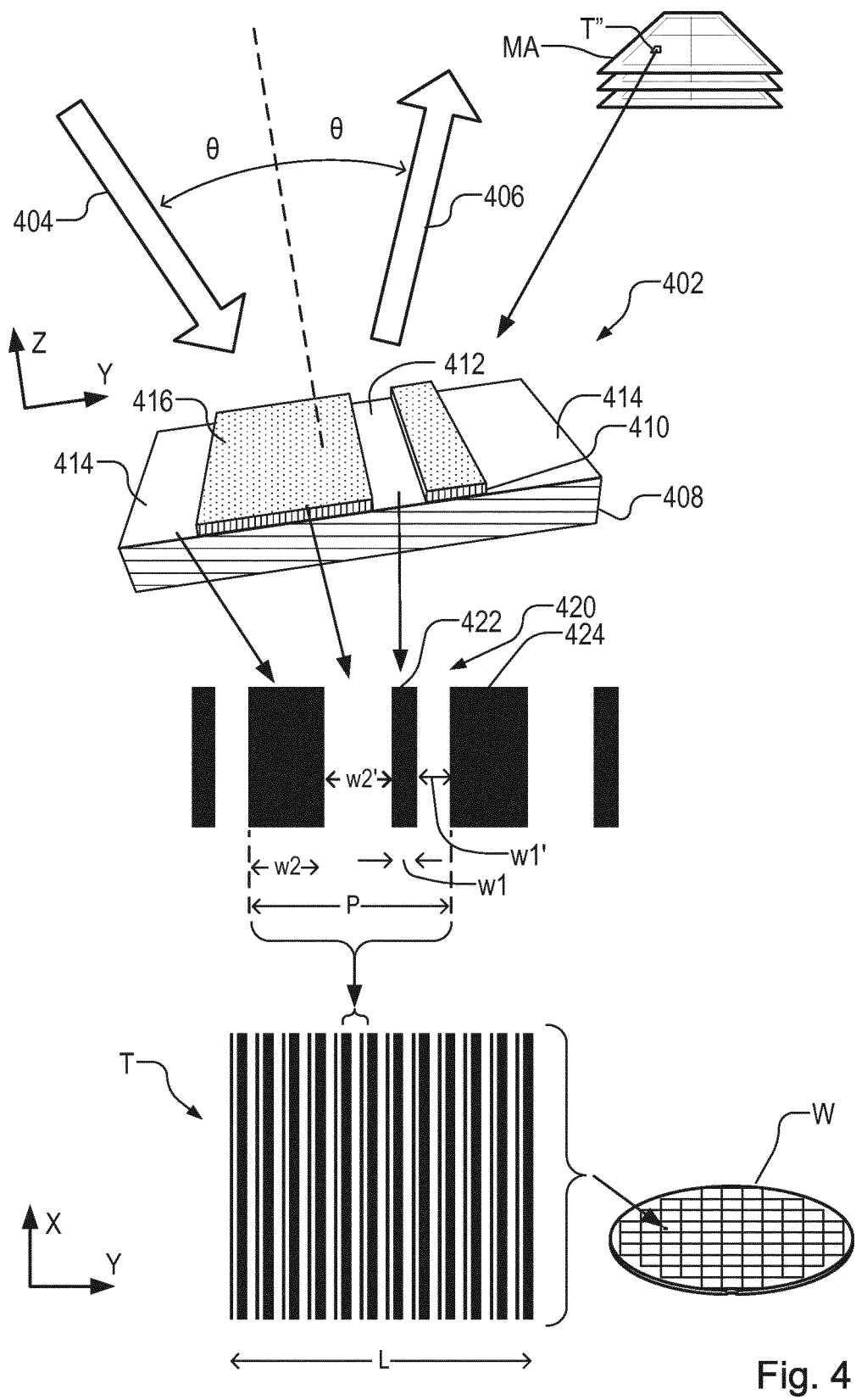
FIG. 4 illustrates the formation of a focus metrology target on a substrate using a reflective patterning device in one embodiment of the present invention.

FIG. 4 illustrates the principles of a method of measuring focus performance of a lithographic apparatus according to the present disclosure. In the disclosed method, the lithographic apparatus is used to print at least one focus metrology pattern T on a substrate W. The printed focus metrology pattern T comprises an array of features that is periodic in at least one direction. For the purpose of this example, the focus metrology pattern T is periodic in the Y direction, which corresponds to the scanning direction of the lithographic apparatus. In a lithographic apparatus of the type described, the direction of illumination is at an oblique angle, within the Y-Z plane. The focus metrology pattern T is made periodic in this Y direction, to exploit the asymmetry in the imaging process, caused by this obliqueness of illumination. By measuring asymmetry in the printed focus metrology pattern, for example using an inspection apparatus of the type described above, a measurement of focus performance can be derived.

Patterning device MA comprises reflective and non-reflective portions to define features of one or more device patterns and one or more metrology patterns. As one type of metrology pattern of interest for the present disclosure, a focus metrology pattern T to be formed on the substrate W is defined by a corresponding pattern T" formed on reflective patterning device MA. An enlarged detail of part of the reticle is shown at 402. The printing operation which transfers this pattern onto a resist layer on substrate W is performed in the lithographic apparatus of FIG. 1 by illuminating the reticle with EUV radiation 404 radiation incident at an oblique angle θ, which may be for example in the range of 5° to 10°. Reflected radiation 406 carrying information of the metrology target pattern (and all the product features desired to be printed on the substrate) enters the projection system PS. The basis of the reticle is a reflective structure 408, which is typically a multilayer structure, adapted to reflect a wavelength of radiation used in the lithographic apparatus. The EUV radiation is typically shorter than 20 nanometers. For example, a wavelength of approximately 13.5 nm is used in current implementations, which are based on a tin plasma radiation source.

On top of the reflective structure 408, radiation-absorbent structure 410 is provided, which may comprise a layer of EUV-absorbing material, and optionally a protective capping layer. Structure 410 is selectively removed so as to leave reflecting portions 412, 414 and non-reflecting portions 416, in accordance with the pattern that is desired to be printed in the resist material on the substrate. Depending on the type of resist material used, the developed pattern may have resist features corresponding to the reflective portions (negative tone resist) or to the non-reflective portions (positive tone resist). For the present illustration, a positive resist process will be assumed, unless otherwise stated. The teaching of the present disclosure can readily be adapted by the skilled person to either type of process.

Focus metrology pattern T comprises a grating pattern with a length L in a direction of periodicity. The direction of periodicity in this example is the Y direction, as mentioned. The period P of the structure is marked, and an enlarged portion of the pattern including one of the repeating units 420 is shown. Each repeating unit in this example comprises a group of one or more first features 422 and one or more second features 424. Each group of the first features 422 in this example comprises a thin bar structure defined by the narrow reflecting portions 412 on the reticle portion 402. The skilled person will understand that the projection system PS of a typical lithographic apparatus will apply a predetermined de-magnification factor when printing the pattern from the patterning device MA onto the substrate W. Accordingly, the dimensions of features given in the following examples will be understood to refer to the sizes of features as printed on the substrate, and the sizes of the corresponding features on the patterning device such as reticle 402 may be physically several times larger. This scaling factor should be taken for granted in the following description, and will not be mentioned again. Similarly, unless the context otherwise requires, the dimensions of features of the metrology pattern T are stated as the would be if the pattern is perfectly transferred from the patterning device to the resist. As will be appreciated, the basis of the focus metrology method is that the features will not be perfectly printed, when a non-zero focus error is present.

The wavelength of radiation used in the printing step, for example EUV radiation, is much shorter than the wavelengths of radiation typically used to measure asymmetry in the inspection apparatus of FIG. 3. EUV radiation may be defined as radiation in the range 0.1 nm to 100 nm while the wavelength of radiation used in the printing step may be for example less than 20 nanometers. The inspection apparatus in some embodiments may use visible or infrared radiation at one or more wavelengths in the range 200 nm to 2000 nm. The wavelength of radiation used in the printing step may be in such cases ten or more times shorter than the wavelength of radiation used in the measuring of asymmetry. In other examples, the wavelength of the measuring radiation may be shorter than 200 nm, for example in the range 150-400 nm or even 100 nm to 200 nm.

Whichever radiation wavelengths are used for the printing of the pattern and the measuring of it, the focus metrology pattern contains features with a range of properties adapted to suit these conditions. The first features 422 are designed to have a dimension similar to the smallest features printed as part of the product patterns. If this were not so, then focus performance measured using the focus metrology pattern T might not accurately represent focus performance in the actual product features of interest.

On the other hand, in view of the longer wavelengths used in the inspection apparatus (even allowing for the fact that inspection apparatus using shorter wavelengths might be applied), these individual first features are too small to be resolved directly by the inspection apparatus. By arranging groups of first features in a grating pattern having an overall period P that is comparable to the inspection apparatus wavelength, a diffraction spectrum of the pattern as a whole becomes resolvable in the inspection apparatus, and properties of the smaller features can be inferred. The period P of the grating pattern may for example be 350 nm or 450 nm or 600 nm. The overall length L of the grating pattern may be, for example, 5 μm. Such a size allows the pattern to be included within device areas, but still resolved using the dark-field imaging branch of the inspection apparatus of FIG. 3. (If measurements are to be made using the pupil imaging branch, then a larger target is typically required, for example with L of 30 μm or 40 μm so that the illumination spot S can be placed entirely within the grating.) The relative sizes of features and gratings, and numbers of features in each grating are not intended to be shown to scale in any of the figures here.

Examples according to the First Aspect of the Present Disclosure

Figure 5:
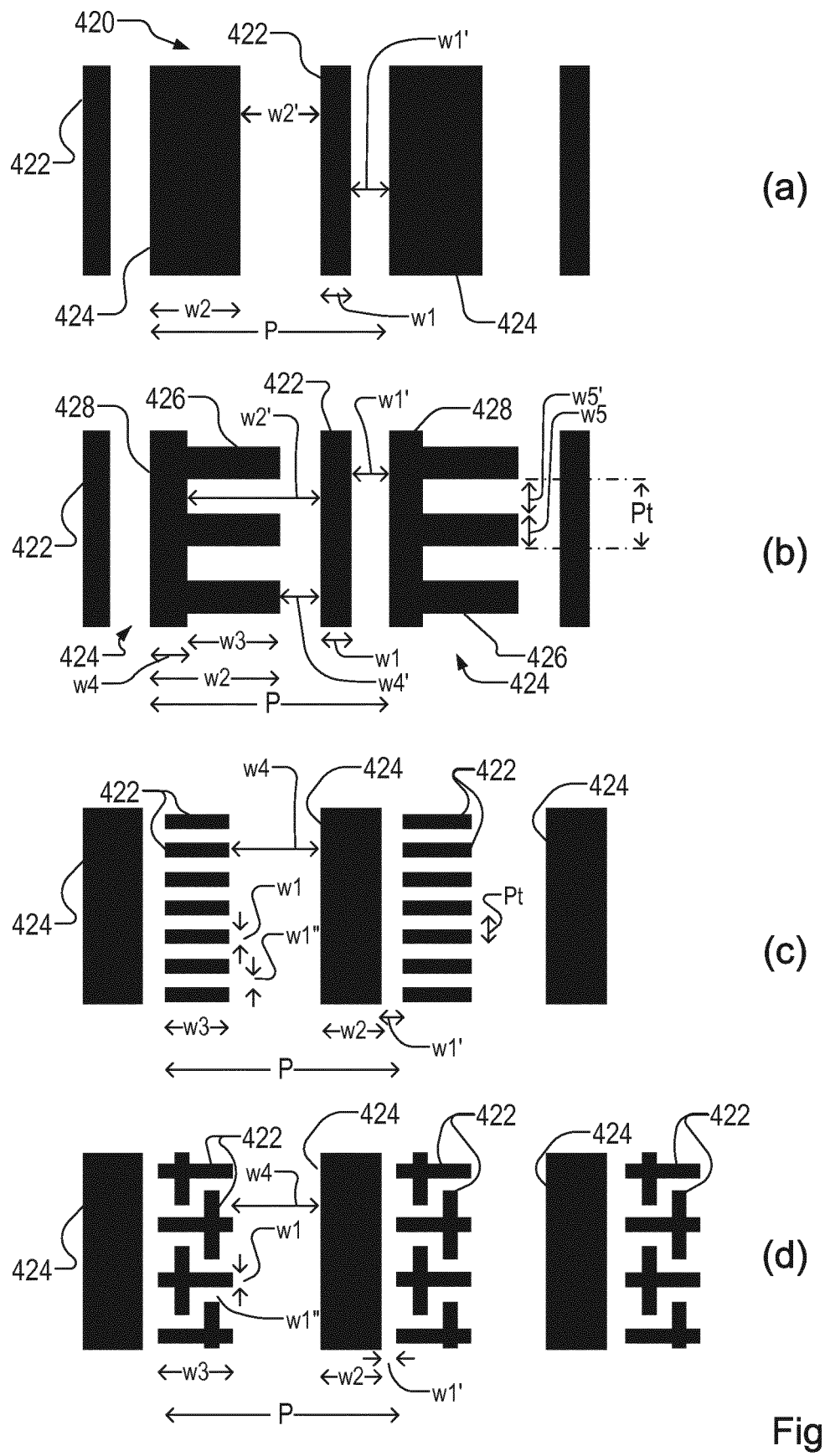
FIG. 5 shows schematic detail of four example focus metrology patterns (a) to (d) for use in embodiments of the first aspect of the invention.

FIG. 5 illustrates various focus metrology patterns that may be used, and of course other examples can be envisaged, based on the principles disclosed herein with reference to the first aspect of the invention mentioned in the introduction. In all of the examples, only a small section of the pattern is shown, including a repeating unit with period P.

FIG. 5 (a) shows in isolation a small portion of the same focus metrology pattern that is used as the example in FIG. 4. The repeating unit of this pattern comprises one first feature 422 and one second feature 424, spaced from each other in the direction of periodicity. The direction of periodicity in this example may be the X direction of the patterning device and substrate. Each first feature 422 comprises a bar or other feature each having a minimum dimension w1 that is close to but not less than a resolution limit of the printing step. This value w1 may be for example less than 50 nanometers in the direction of periodicity. It may be similar to, or a little smaller than, the critical dimension CD of the smallest features in the product patterns that are to be printed on the same or another substrate, using the lithographic process. In one example, the line width of these features might be 22 nm. In other examples, the line width of these features might be in the range 15 nm to 50 nm, or 20 nm to 45 nm. On the other hand, a maximum dimension w2 of each second feature 424 in the direction of periodicity is much greater than said resolution limit. For example, the maximum dimension w2 of the second features may be two or more times the minimum dimension w1 of the first features, and may be more than three or four times. It may be noted that, in this example, the maximum dimension w2 is also the minimum dimension of the second features in the direction of periodicity. Other embodiments will be illustrated in which this is not the case.

The space between each first feature 422 and its nearest neighboring second feature 424 has a dimension w1' and is also close to but not less than the resolution limit of the printing step. It may be equal to or slightly different from the dimension w1 of the first feature 422. ("Slightly different" in this context could be taken to include a ratio between one half and two times.) A second space, between each first feature 422 and its next nearest neighboring second feature 424, has a dimension w2' and is similar to the dimension w2 of the second features 424 themselves. Consequently, it will be seen that the pattern T comprising thin first features and thicker second features is effectively present in both positive and negative form. Putting these dimensions w1, w1' together with the much larger period P, it will be appreciated that the dimensions w2 and w2' are much greater than the minimum dimension w1 of the first features 422, and consequently much greater than the resolution limit of the printing step. Dimensions w2 and w2' may each be, for example, over four times, over five, six, eight or ten times the dimension w1.

Several parameters of the focus metrology pattern can be adjusted as part of a design process for an optimal focus metrology pattern. The optimal focus metrology may be different for each layer and each process of a product, particularly where operating parameters of the lithographic apparatus may be customized for each layer. Dimensions w1 and w1' may be chosen to be equal to one another, or slightly unequal, as shown. For example, the first space dimension w1' may be between one half and two times the first feature dimension w1. Similarly, the second space maximum dimension w2' may be between one half and two times the second feature maximum dimension w2. Design parameters may be expressed in any suitable format. Ratios such as the ones just given may be convenient for expressing relative dimensions of features, while absolute dimensions may be expressed directly, or by ratios relative to a specified resolution limit, and/or relative to the period P. Of course the total of the dimensions w1, w1', w2, w2' in this example must equal the period P.

In the illustrated example, with a period P of 450 or 600 nm and a linewidth w1 on the order of 22 nm for the first features, the maximum dimensions of the second features and second spaces w2 and w2' may each be over 100 nm, or over 200 nm or over 250 nm. Generally speaking, the person skilled in imaging technology will consider that features are effectively isolated from one another, if the space between them is five or six times dimensions of the features themselves.

Thus, in this example, each first feature is close to one of its neighboring second features, but isolated from its other neighboring second feature.

The inventors have found that, with appropriate design, focus performance measurements can be obtained from target gratings of the form shown in FIG. 5(a), using the diffraction-based asymmetry measurement functions of a scatterometer such as the inspection apparatus of FIG. 3. This asymmetry can be measured very simply, using the pupil imaging branch of the inspection apparatus (sensor 19), or using the dark-field imaging branch (sensor 23). Compared with other measurement techniques, such as reconstruction or focus-dose modeling, very simple signal processing is required. In certain embodiments, as explained in more detail below, a focus metrology target pattern may comprise a complementary pair of gratings of this type. Combining the asymmetries measured for these complementary gratings allows both the sign and the magnitude of a focus error to be measured.

This type of pattern may be used to measure focus performance for an EUV lithographic process using a reflective patterning device MA, or a conventional transmissive process. In the case of a lithographic process with asymmetric illumination, such as an EUV lithographic process, additional focus-dependent asymmetry effects may be expected. One of these effects is that the positions of the thin features 422 will shift relative to the positions of the fatter features 424, under the asymmetrical illumination. This contributes an additional component of asymmetry, which with appropriate design can enhance the focus signal.

FIG. 5 (b) presents another example of a focus metrology pattern which differs from that of FIG. 5 (a) in that each second feature in the periodic array further includes subfeatures 426 having minimum dimensions close to but not less than a resolution limit of the printing step in a direction transverse to said direction of periodicity. The sub-features in this example are lines projecting asymmetrically from a main body 428 of the first feature. The length of these projecting lines or fingers is labelled w3. The main body 428 of each second features 424 defines a minimum dimension w4 of the second features in the direction of periodicity. Accordingly, in this notation, maximum dimension w2 of the second features 424 is equal to w3+w4. The minimum dimension of the sub-features in the transverse direction is labeled w5.

Like the example of FIG. 5(a), the example of FIG. 5(b) can be seen in both positive (black on white) and negative (white on black) versions at the same time. The dimensions w1', w2', w3', w4', w5' of the negative version are marked in the drawing. It will be seen that the dimensions w1, w1', w3, w4 add up to one period P. The dimensions w5 and w5' at up to one period Pt in the transverse direction. Depending on the chosen design parameters, the dimensions of the positive and negative versions may be identical (but in mirror image), or different. Compared with the example of FIG. 5(a), the example of FIG. 5(b) has a larger number of parameters that can be varied to optimize the sensitivity to focus, and to reduce sensitivity to other effects. The minimum dimensions of the sub-features 426 may be the same as or different to the minimum dimensions of the first features.

Figure 6:
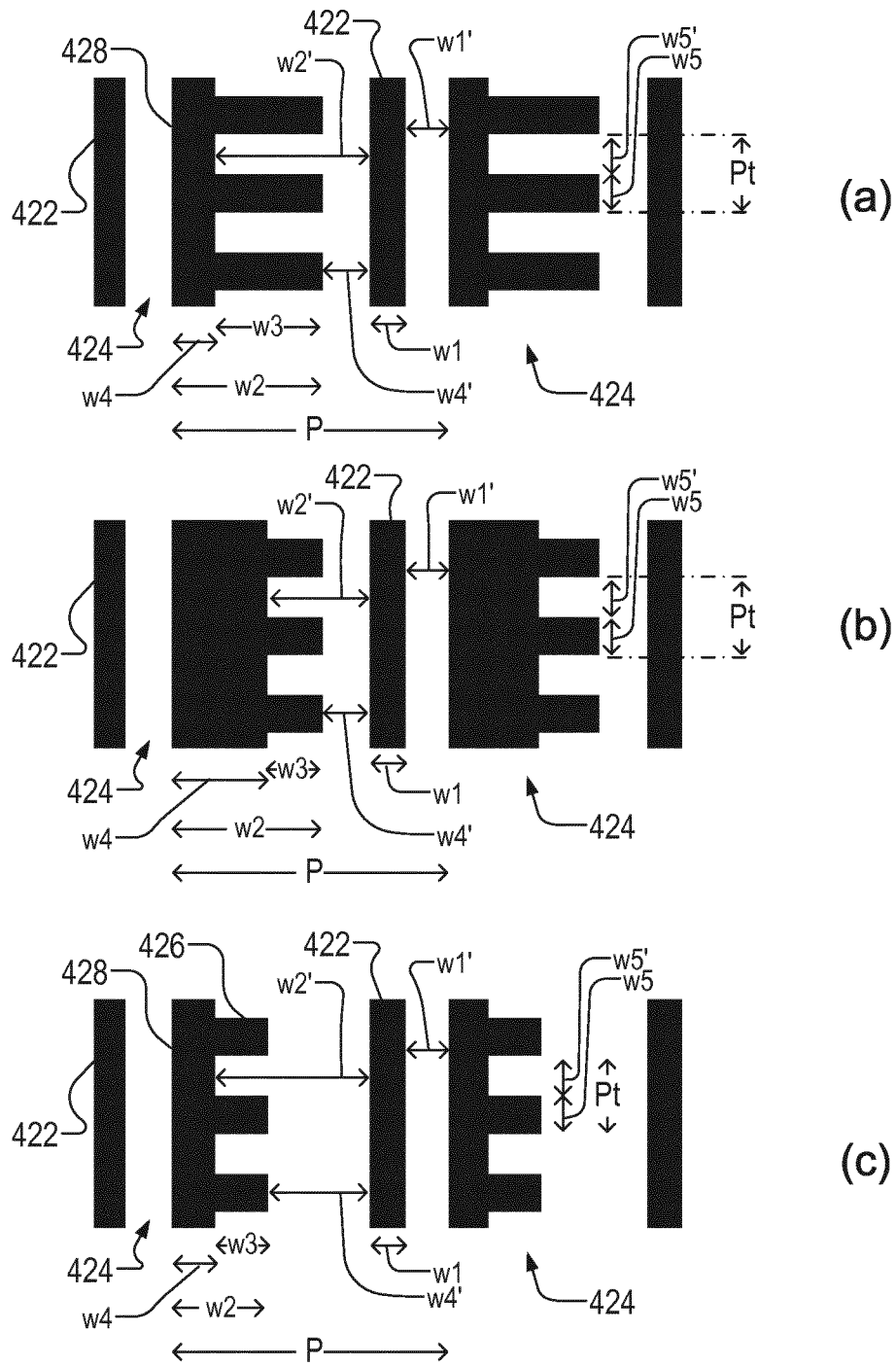
FIG. 6 illustrates some variations (a)-(c) of design parameters in a focus metrology pattern of the type shown in FIG. 5 (b)

FIG. 6 illustrates the result of varying some of the design parameters in the manner just described. In FIG. 6 (a), the dimensions are the same as in FIG. 5 (b). In FIG. 6 (b), the minimum dimension w4 defined by the main body 428 of the second features has been increased compared with FIG. 5 (b), while the dimension w3 has been decreased. The maximum dimension w2 of the second feature and its spacing from the first features has been maintained the same. Other parameters, such as the minimum dimension w4' of the second feature in the negative (white on black) version of the pattern, have not been changed. In FIG. 6 (c) the dimensions are changed in a way that is opposite to the changes in FIG. 6 (b). The minimum dimension w4 defined by the main body 428 of the second features has been maintained the same as in (a). The length of the sub-features 426 (dimension w3) has been reduced, so that the maximum dimension w2 of the second feature 424 in the direction of periodicity is reduced and its spacing w4' from the first feature at one side has been increased compared with FIG. 5 (b). The minimum dimension of the second feature in the negative (white on black) version of the pattern has increased in this case.

Any of the parameters not varied in the examples of FIG. 6 can be varied. For example the transverse period Pt can be varied, and also the ratio w5:w5' of the "finger" dimensions, within each. As may be expected, the period Pt of the array of first features in the transverse direction, will be much smaller than the period P in the direction of periodicity, which refers to periodicity of the focus metrology pattern as a whole.

Another design parameter of interest is the evenness of positioning of the first features between the neighboring second features. For example, in the black on white pattern, the situation w1'=w4' represents a positioning of each first feature exactly midway between its neighboring second features. In the white on black pattern, the situation w1=w4 represents the positioning of each first feature exactly midway between its neighboring second features. Some embodiments may therefore be defined by a design rule such that the spaces either side of each first feature are generally similar, for example with of one space being between one half and two times the other, or between two thirds and 1½ times.

The circumstances under which each variant will work better or worse than another are dependent on the process, and the design is therefore to be optimized by use of simulation and/or experiment. One of these variants (b) or (c) in FIG. 6 may be suited to negative tone development processes (where we assume that the developed resist remains where it has been exposed to radiation in the black on white pattern), while the other one is more suited to positive tone development processes (where the developed resist remains where it has not been exposed, corresponding to the white on black pattern).

Returning to FIG. 5, variant (c) differs from those of FIGS. 5 (a) and (b) in that each first feature 422 in the periodic array has its minimum dimension w1 in a direction transverse to the direction of periodicity. The minimum dimension w1 of each first feature is still close to but not less than a resolution limit of the printing step. (It will be understood from this that the dimensions in FIG. 5 (a) to (c) are not to scale.) Each first feature in this example comprises a bar with a length w3 in the direction of periodicity that is substantially longer than the minimum dimension, although this is only one possible configuration. Spaces w1" between the first features in the transverse direction are also comparable to the resolution of the printing step. They may be the same as or different to the minimum dimension w1 of the first features themselves, and with the space w1' between each first feature and its nearest second feature.

Depending on the lithographic projection system, and also depending on chosen modes of illumination, for example, the resolution limit of the printing step in one direction may be different from the resolution limit in another direction. This difference, where it exists, can be taken into account in the setting of the different parameters, and in the interpretation of the language of the claims. Bipolar illumination modes are sometimes chosen, for example, specifically to enhance resolution in one direction preferentially over the other.

The dimensions of the second features 424 and the spacings between the first features and the second features are also parameters of the design that can be defined and set according to the same principles as the examples of FIGS. 5 (a) and (b). The parameters can be designed through a mixture of absolute and relative values, for convenience. The minimum dimension w1 of the first features may be for example less than 50 nanometers. It may be similar to, or a little smaller than, the critical dimension CD of the smallest features in the product patterns letter to be formed on this or another substrate by the lithographic process. In one example, the line width of these features might be 22 nm. In other examples, the line width of these features might be in the range 15 nm to 50 nm, or nm to 45 nm. On the other hand, a maximum dimension w2 of each second feature 424 in the direction of periodicity is much greater than said resolution limit. For example, the maximum dimension w2 of the second features may be two or more times the minimum dimension w1 of the first features, and may be more than three or four times.

Dimensions w1, w1' and w1" may be chosen to be equal to one another, or slightly unequal, as shown. For example, the space dimensions w1' and w1" may each be between one half and two times the first feature dimension w1. Design parameters may be expressed in any suitable format. Ratios such as the ones just given may be convenient for expressing relative dimensions of features, while absolute dimensions may be expressed directly, or by ratios relative to a specified resolution limit, and/or relative to the period P, and/or relative to the transverse period Pt. Of course the total of the dimensions w1', w2, w3 and w4 in this example must equal the period P. Similarly, the total of the dimension w1 and w1" must equal the transverse period Pt.

It will be seen that the negative (white on black) form of the focus metrology pattern in this example does not have the same form as its positive (black on white) counterpart. However, a negative counterpart of the illustrated pattern can of course be made, if desired.

FIG. 5 (d) shows another variant. This is similar in character to the example of FIG. 5 (c), but the first features have two-dimensional characteristics, being for example T-shaped, cross-shaped and/or L-shaped. The design of the first features can for example be based on actual product features to be produced by the lithographic process.

While targets including the above focus metrology target patterns may yield focus measurements (when appropriately designed for the process), there is also an expectation that the focus measurement of a target will be subject to uncertainty because of the wide variety of aberrations that can be introduced, besides focus. Accordingly, embodiments of the measurement method are also disclosed in which multiple differential measurements are made on two or more focus metrology patterns. These may be provided in complementary pairs, with mirrored asymmetry in their designs, and/or in pairs with design differences other than mirror symmetry.

Figure 7:
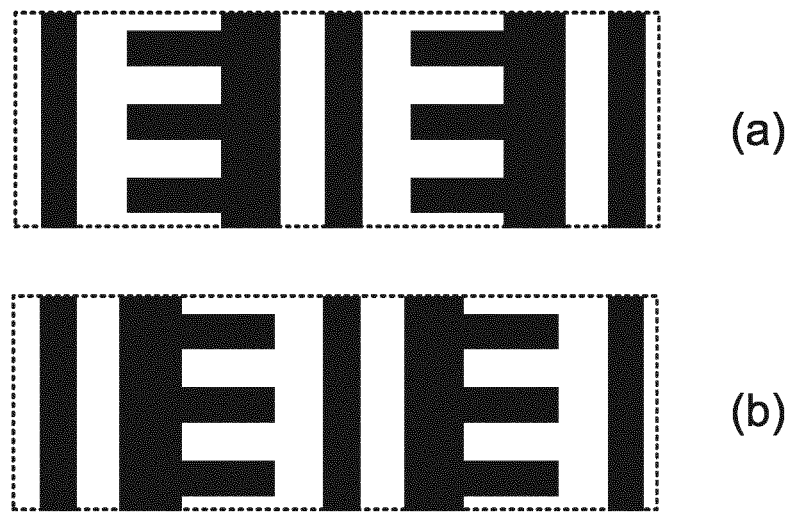
FIG. 7 illustrates in more detail (a) a part of a focus metrology pattern of the type shown in FIG. 5 (b)

FIG. 7 illustrates two complementary focus metrology patterns that can be used together to obtain an improved measurement of focus. Purely by way of example, the pattern of FIG. 5 (b) has been selected as the basis for this complementary pair, as seen in FIG. 7 (a). The other pattern of the pair seen at FIG. 7 (b) is a mirror image.

Figure 8:
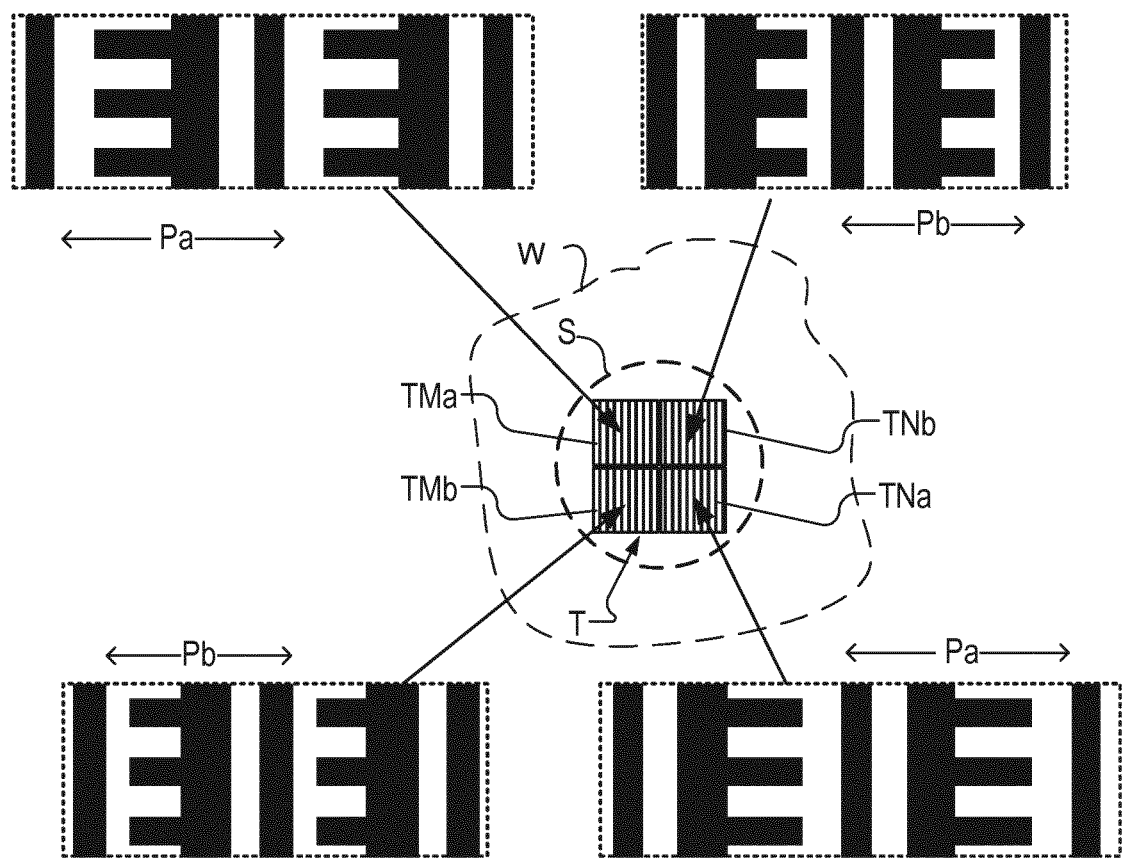
FIG. 8 shows the formation of a composite focus metrology target comprising complementary variants of focus metrology patterns of the type shown in FIGS. 7(a) and (b)

FIG. 8 shows the printing of two or more complementary patterns side by side on a substrate W, forming a composite focus metrology target T. In this particular example, there are four focus metrology patterns, arranged in two complementary pairs TNa/TMa and TNb/TMb. In each complementary pair, the first pattern (printed on the right) is labeled TN (using N for 'normal') while the second pattern is printed on the left and labeled TM (M for 'mirror'). It will be understood that the labels are arbitrary, but the effect is that the printed focus metrology pattern comprises at least first and second periodic arrays of features, each periodic array of features forming an individual focus metrology pattern. There is then a programmed asymmetry within each periodic array, the asymmetry of the second periodic array being opposite to that of the first periodic array, to form a complementary pair. To obtain an improved focus measurement then includes measuring asymmetry of each of the first and second periodic arrays and determining a measure of focus performance by combining the asymmetries measured for the periodic arrays (TN, TM).

By combining results from measurements using targets that have opposite asymmetries in their designs, the focus measurement can be made less sensitive to asymmetries that arise in the projection system or the metrology system, that otherwise might be mistaken for focus error. Particular types of imperfection that can be discriminated using a complementary pair of patterns in this way are coma and projection asymmetry. For example, coma may be expected to introduce asymmetry in a particular direction, when the image is defocused. By contrast, the asymmetry induced by focus error will be opposite in the "mirrored" pattern compared with the "normal" pattern. Combining the asymmetry measurements from both allows the actual focus error to be more accurately measured.

Additionally, in this example, two complementary pairs of targets are provided, identified by the suffixes 'a' and 'b'. Between these pairs, the design parameters of the focus metrology patterns are varied. As a first difference, the period Pa of the pair TNa/TMa is longer than the period Pb of the pair TNb/TMb, and lengths of the "fingers" have been shortened. In other embodiments, different parameters could be varied, and the periods could be the same or different. Alternatively or in addition to providing different pattern designs, different capture conditions can also be used to obtain more diverse signals. For example, different wavelengths and/or polarizations of radiation can be used to obtain diffraction signals.

Figure 9:
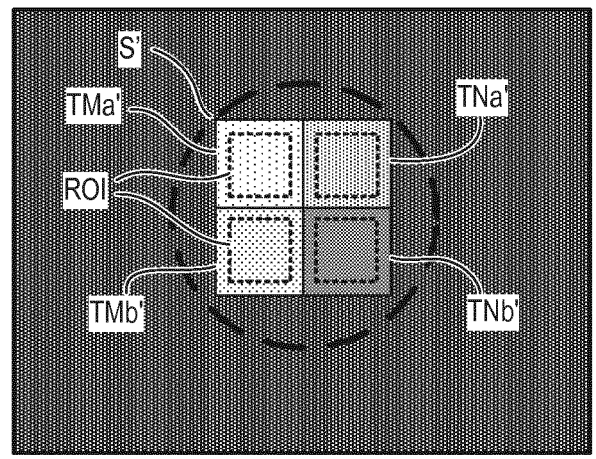
FIG. 9 shows a dark-field image of the metrology focus patterns of the target of FIG. 8, obtained using the apparatus of FIG. 3.

As illustrated in FIG. 8, therefore, a composite focus metrology target T can be formed by one or more complementary pairs focus metrology patterns TN and TM being printed in the same step. As illustrated, these individual patterns may be imaged simultaneously using radiation spot S in the dark field imaging mode of the inspection apparatus of FIG. 3. In other words, measurements of asymmetry in both of these focus metrology patterns can be taken by taking first and second images using the +1 and −1 order diffracted radiation collected by the apparatus. One such image is shown in FIG. 9. The dark rectangle represents the dark-field image as recorded on sensor 23 in the apparatus of FIG. 3, for example. A circle S' indicates the area of radiation spot S, imaged onto the detector. Brighter rectangles TNa', TNb', TMa' and TMb' represent the images of the corresponding focus metrology patterns TNa, TNb, TMa and TMb, respectively. The intensity of one diffraction order from each target can be measured by, for example, defining a region of interest ROI within each of the brighter rectangles, and averaging the pixel values. Repeating this for the opposite diffraction order allows asymmetry to be calculated. In an alternative measurement method using the prisms 21b shown in FIG. 3, then effectively both images of both patterns can be captured simultaneously.

The principles illustrated in FIGS. 7 to 9 can be applied to any of the patterns illustrated in FIGS. 5 and 6.

In yet other embodiments, asymmetry of each focus metrology pattern may be measured separately, for example using the pupil imaging branch of the inspection apparatus of FIG. 3, or a more general angle-resolved scatterometer. The opposite diffraction orders from one pattern are located in complementary regions of the pupil image, but only one pattern can be measured at a time.

Figure 10:
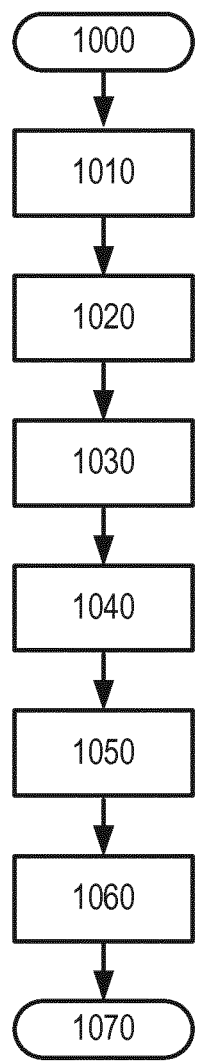
FIG. 10 is a flowchart of a method of monitoring focus according to an embodiment of the invention.

FIG. 10 is a flowchart of the steps of a method for measuring focus performance of a lithographic process according to an exemplary embodiment. The method can be performed using any of the example focus metrology patterns described above and illustrated in the drawings. The steps are as follows, and are then described in greater detail thereafter:

1000—Start by defining a product design or metrology wafer design with metrology targets, and preparing a suitable set of patterning devices (reticles). In advance of production, make exposures with known focus-exposure variations and measure these to obtain one or more calibration curves. (This may involve an iterative loop of design, exposure and measurement steps.)

1010—Print one or more focus metrology patterns alongside product patterns on a substrate;

1020—Measure intensity of a portion of the diffraction spectrum of each focus metrology pattern using a suitable inspection apparatus (for example the +1 order is a suitable portion of the diffraction spectrum);

1030—Measure intensity of an opposite portion of the diffraction spectrum (for example, −1 order) of each focus metrology pattern using the inspection apparatus;

1040—Calculate measurements of asymmetry of one or more focus metrology patterns by comparing the intensities of the opposite diffraction orders;

1050—Using the asymmetry measurements, with the calibration curves stored in step 1000 and/or other measurements such as SEM, calculate focus error at the time of printing the focus metrology pattern.

1060—Use the derived focus measurement in focus setting for exposures on subsequent substrates.

1070—End or repeat.

As already explained, step 1020 and step 1030 may be performed as a single step such that the opposite diffraction orders of a focus metrology pattern can be obtained in a single acquisition. In addition, where there are two or more patterns being measured, for example one or more complementary pairs of patterns shown in FIG. 8, opposite diffraction orders for these two or more patterns may be measured using a single image acquisition, to obtain a corresponding number of asymmetry measurement values.

Although the measurement steps are shown being made by a scatterometer, as a dedicated inspection apparatus, this may be a stand-alone apparatus or it may be integrated in the lithocell. Moreover, asymmetry measurements can be made without dedicated metrology apparatus, for example using suitable targets with the alignment sensors provided in the lithographic apparatus. Calculation steps 1040 and 1050 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

Examples according to the Second Aspect of the Present Disclosure

Figure 11:
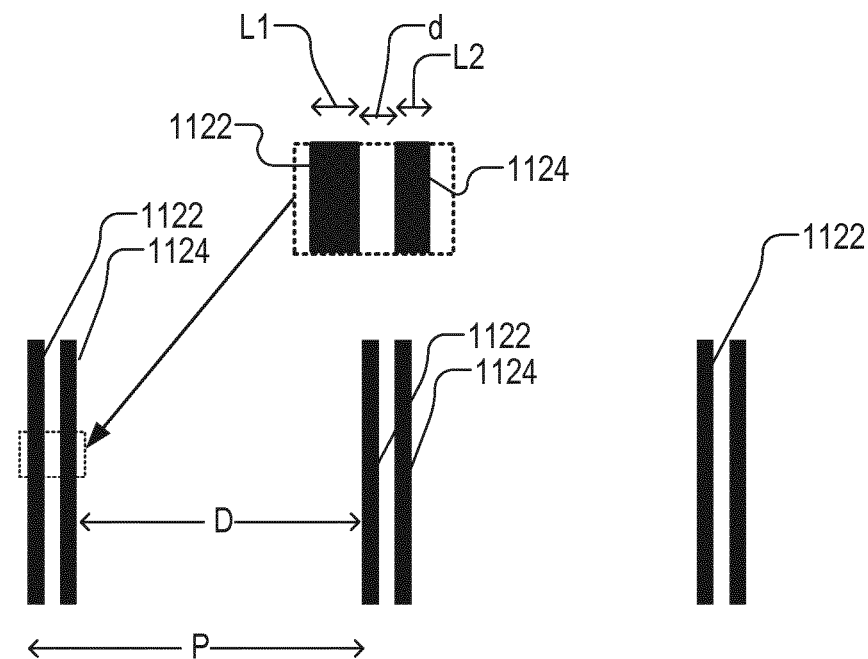
FIG. 11 shows schematic detail of two example focus metrology patterns (a) and (b) for use in embodiments of the second aspect of the invention.
Figure 11:
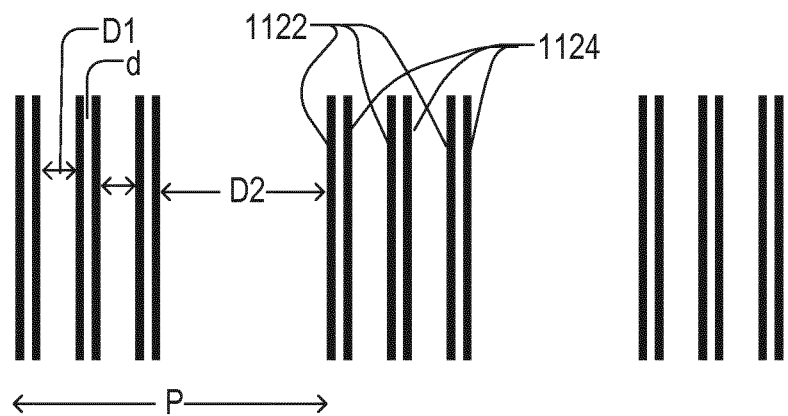

FIG. 11 illustrates two further examples of focus metrology patterns that may be used, and of course other examples can be envisaged, based on the principles of the second aspect if the invention disclosed herein. In these examples, a focus metrology pattern comprises an array of pairs of features 1122, 1124 that is periodic in at least one direction. Only a small section of the pattern is shown, including a repeating unit with period P. The example of FIG. 5 (a) comprises only one pair of features 1122, 1124 per period. An enlarged view of part of one pair of features is shown in the inset detail, so that certain dimensions can be labeled. The dimensions are measured in the direction of periodicity. A minimum dimension L1, L2 of each feature in the direction of periodicity is close to but not less than a resolution limit of the printing step, when perfectly focused. In the illustrated example, the dimensions L1, L2 of the features within each pair and the dimension of the spacing d between the features within each pair are all of the same order of magnitude. The dimensions L1 and L2 of the features 1122, 1124 within a pair may be equal in some embodiments, or they may be unequal, as shown in the inset detail. The dimension of the spacing d between the first features within each pair may be for example between one and 1½ times the average dimension of the features 1122, 1124 within each pair, or between one and two times. The dimension of the spacing d between the first features within each pair may be for example between one and 1½ times the minimum dimension of the features within each pair, or between one and two times. A spacing D between the pairs of features in the direction of periodicity is much greater than both the minimum dimension of each feature and the spacing d between the features within a pair.

Referring again to FIG. 4, it will be readily appreciated how the reflective and non-reflective portions of a reticle can be designed to achieve this pattern, instead of the pattern shown in FIG. 4. In some embodiments, the bars that are the features 1122, 1124 will be defined by narrow non-reflective portions on the reticle, within a generally reflective background, whereas in other embodiments the features 1122, 1124 may be defined by reflective bars within a generally non-reflective background. In either case, the choice of positive tone resist or negative tone resist will determine whether these first features are represented as remaining resist in the developed focus metrology pattern, or whether they are represented as absence of resist. The principles of the disclosure are the same in all these variations.

FIG. 11 (b) illustrates a pattern that is effectively the same as that in FIG. 11 (a), except that a number of pairs of features 1122, 1124 are provided in each period P of the focus metrology pattern. That is to say, the focus metrology pattern in this example comprises a periodic array of groups of pairs of features. The drawing is not to scale. The number of pairs in each group in this example is three, but it could be any number that fits within the period P, and subject to the following constraints. The effect of multiplying the number of pairs is simply to amplify the diffraction signals obtained from the pattern, compared with the single pair pattern shown in FIG. 11 (a). Otherwise, the functioning of both patterns is the same. A spacing D1 between adjacent groups of pairs of features within the focus metrology pattern in the direction of periodicity is much greater than the dimensions L1, L2 of each feature 1122, 1124 and much greater than the spacing d between features within a pair. Additionally, the spacing D2 between groups of pairs is much greater than the spacing D1 between the pairs within a group. More examples of design rules will be presented below.

As will be described below, patterns of the type illustrated can be printed with focus-dependent asymmetry by a variety of methods. Some of these methods are applicable in reflective (e.g. EUV) projection systems only, while others may be applied in more conventional projection systems. For example, the dimensions L1 and L2 of the features 1122 and 1124 within a pair may be equal, or they may be unequal. An example with unequal dimensions is shown in the inset detail in FIG. 11 (a). The same option applies in the pattern of FIG. 11 (b). In the case where the dimensions within a pair are unequal, this automatically introduces an asymmetry that can be measured with the inspection apparatus of FIG. 3, for example. By suitable choice of the dimensions, the asymmetry can be made focus dependent in a monotonic manner, allowing asymmetry measurements to be a means of measuring focus error.

In the case where the dimensions within a pair are equal, a focus-dependent asymmetry can nevertheless be introduced by properties of the printing step. In the case of an EUV lithographic apparatus with the asymmetric illumination and 3-D effects in the reticle as illustrated in FIG. 4, asymmetry can be introduced by inherent properties of the imaging step. In addition, and in other types of projection systems, asymmetry can be introduced by deliberate manipulation of parameters of the projection system and/or process steps such as being reticle characteristics, illumination characteristics, and resist processing. Therefore in one example, an asymmetric reticle feature may be provided. In another example, an asymmetric illumination mode may be used. This holds in principle for all of the targets discussed herein.

Figure 12:
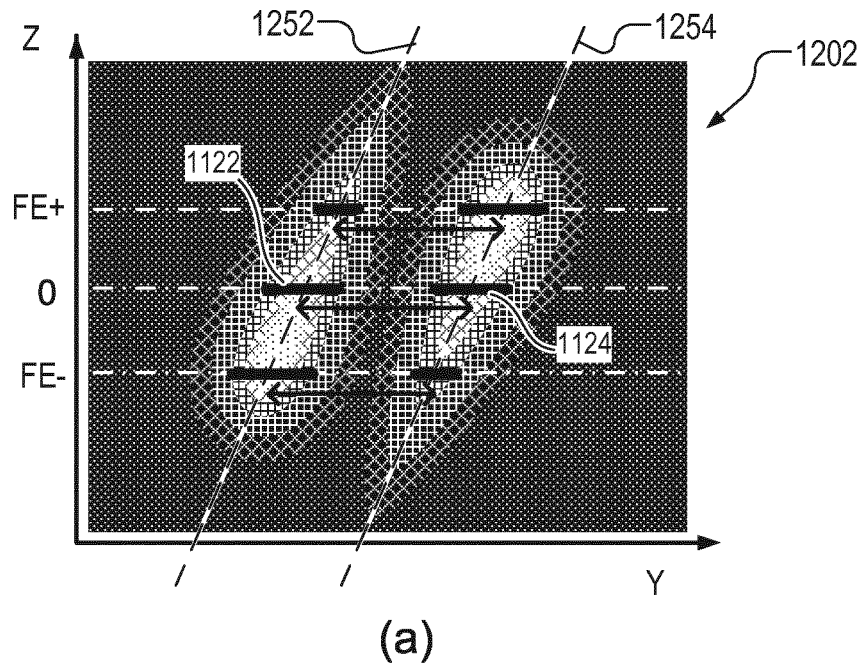
FIG. 12 (a) illustrates the formation of an aerial image of an isolated two-bar feature when printing a focus metrology pattern using oblique illumination in the lithographic apparatus of FIG. 1.
Figure 12:
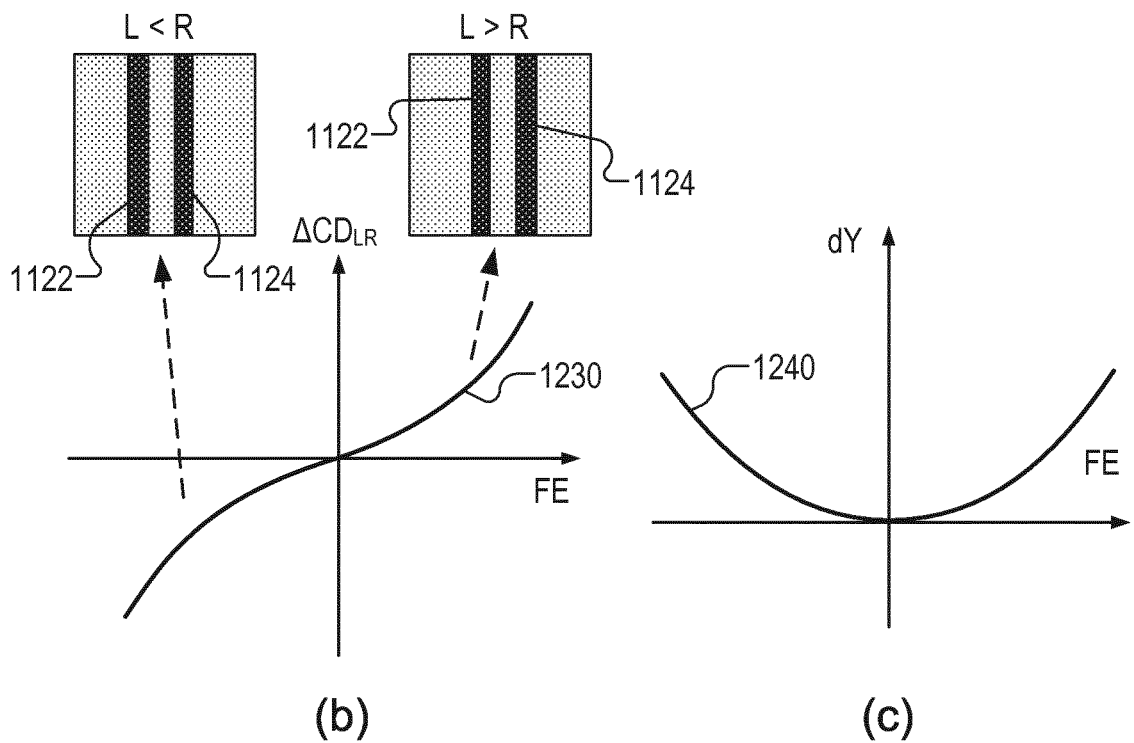

FIG. 12 illustrates a method of this type in which the features within each pair of features are nominally equal in dimension (i.e. equal on the reticle), but an asymmetry is introduced by the nature of the Considering the three-dimensional nature of the reticle 402, in combination with the shadowing effect of the non-perpendicular illumination 404, the projection system PS of the lithographic apparatus 100 prints the first features of the focus metrology pattern in a manner that is dependent on focus. FIG. 12 (a) illustrates schematically the form of an "aerial image" formed by the projection system in the vicinity of the resist. The vertical axis represents focus error FE in a Z direction in the vicinity of the substrate surface where a radiation-sensitive resist coating has been applied. The horizontal axis represents the Y direction, which is also assumed to be the direction of periodicity of the grating pattern T. The aerial image 1202 for a single two-bar feature is shown, it being understood that this pattern repeats across the area of the printed grating. The aerial image has regions of higher intensity indicated by lighter shading in the drawing. Where the intensity exceeds a certain threshold for a sufficient time during the exposure of the substrate W, the resist will react sufficiently to define features of a printed pattern. In a positive tone development (PTD) process, parts of the resist where this threshold is exceeded will be removed during development. In a negative tone development (NTD) process, parts of the resist where this threshold is exceeded will remain after development.

As is well known in imaging practice, the printed pattern is best defined in a plane of focus, represented by zero focus error. Above and below the plane of focus, the intensity of the aerial image is less. Due to the three-dimensional nature of imaging using the reflective optics of an EUV lithographic apparatus, however, the aerial image not only weakens above and below the plane of best focus, but also is distorted in various ways by different aberrations of the projection system.

A first point to note, illustrated clearly in FIG. 12 (a), is that the pair of features have rather unequal shapes in their aerial images, so that each responds differently to a given focus error. The intensity of the left-hand feature initially increases with negative focus error FE−, before decreasing as focus error becomes extreme. Conversely, the intensity of the aerial image for the right-hand feature initially increases with positive focus error FE+. The effect of this in the size of features printed in the resist material is represented by the solid black bars at three representative focus levels (0, FE−, FE+). For a small negative focus error FE−, the width of the left-hand feature actually is greater relative to the right-hand feature. At zero focus error the widths are equal (assuming they are equal on the reticle and all other things are equal). At a small positive focus error FE+, the width of the right-hand feature is greater than that of the left-hand feature.

Figure 13:
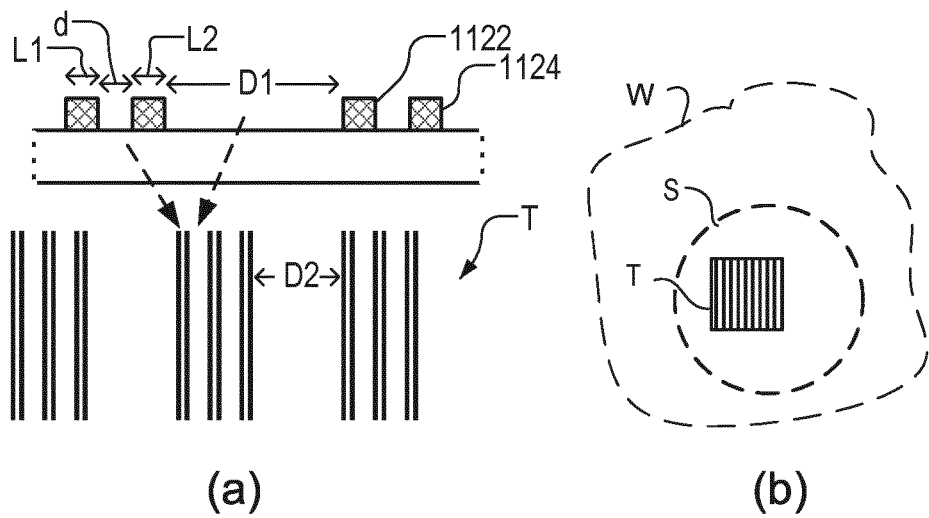
FIGS. 13 (a) and (b) shows the form of a focus metrology target for use in the method of FIG. 12.

FIG. 13 shows an example of the focus metrology pattern used in the method currently being described with reference to FIG. 12. FIG. 13 (a) shows the pattern similar to FIG. 11 (b), with an enlarged cross-sectional detail of a two of the pairs of features 1122 and 1124. The dimensions L1, L2, d, D1, D2 all are marked with the same meaning as in FIG. 11 (b). In this example, it is assumed that (at zero focus error) the features 1122 and 1124 print with equal widths, so that L1=L2. As seen in FIG. 13 (b) the focus metrology pattern including the groups of pairs of features is formed on a substrate W as a focus metrology target T. The asymmetry of the diffraction spectrum of this target can be measured, for example using a spot S of radiation in the inspection apparatus of FIG. 3.

FIG. 12 (b) illustrates how the form of aerial image illustrated in FIG. 12 (a) gives rise to a useful, monotonic response curve 1230 in the asymmetry of a focus metrology pattern, when printed using the lithographic apparatus 100. Plotted on the horizontal axis is focus error FE. Plotted on the vertical axis is the difference $\Delta CD_{LR}$ in critical dimension (CD) between the left features and the right features of the focus metrology pattern. Again, in this example it is assumed that the focus metrology pattern contains pairs of features 1122 and 1124 with equal designed dimensions (L1=L2). The actual dimensions realized in the printed pattern become unequal, and this results in an asymmetry that can be measured using the inspection apparatus of FIG. 3 or other means. For reasons just illustrated in FIG. 12 (a) the region where focus error FE is negative is characterized by an asymmetry in which the left-hand feature (say 1122) is broader than the right-hand feature (1124). Conversely, the region where focus error FE is negative is characterized by an asymmetry in which the left-hand feature (say 1122) is narrower than the right-hand feature. Since the curve 1230 is monotonic, it will be seen that a measurement of asymmetry of such a target will also be monotonic, and therefore can provide a usable measure of focus error, indicating not only the magnitude of the focus error but also its sign.

For comparison, FIG. 12 (c) shows a curve 1240 of the spacing dY, measured for the sake of example between the centers of the features 1122 and 1124. The form of the aerial image1202 is such that this spacing also exhibits a variation with focus error. Although difficult to see in FIG. 12 (a), the bars representing features 1122 and 1124 move slightly further apart under both positive and negative focus error. Therefore, this shift in the relative positions of the features within each pair does not provide a monotonic signal from which focus error can be directly derived.

The illustration provided in FIG. 12 (a) is of course only approximate, and still further effects may arise in the real aerial image. Another effect seen is that the aerial image for each bar has a tilt, because of the oblique illumination used in the projection system PS of an EUV lithographic apparatus 100. The tilt is indicated roughly by the lines 1252 and 1254. Accordingly, the effective position of the printed bars is displaced by an amount which varies with the focus error FE. If the focus metrology pattern is designed so that displacement of narrow bar features can be measured, a measurement of focus can be obtained by measuring this displacement. One way to allow the displacement to be measured is to provide broader features such as the second features 424 in the example patterns of FIG. 5. These broader features do not exhibit the same shift. This is the reason that an additional effect is mentioned above, in relation to the examples of FIGS. 5 (a) and (b).

Figure 14:
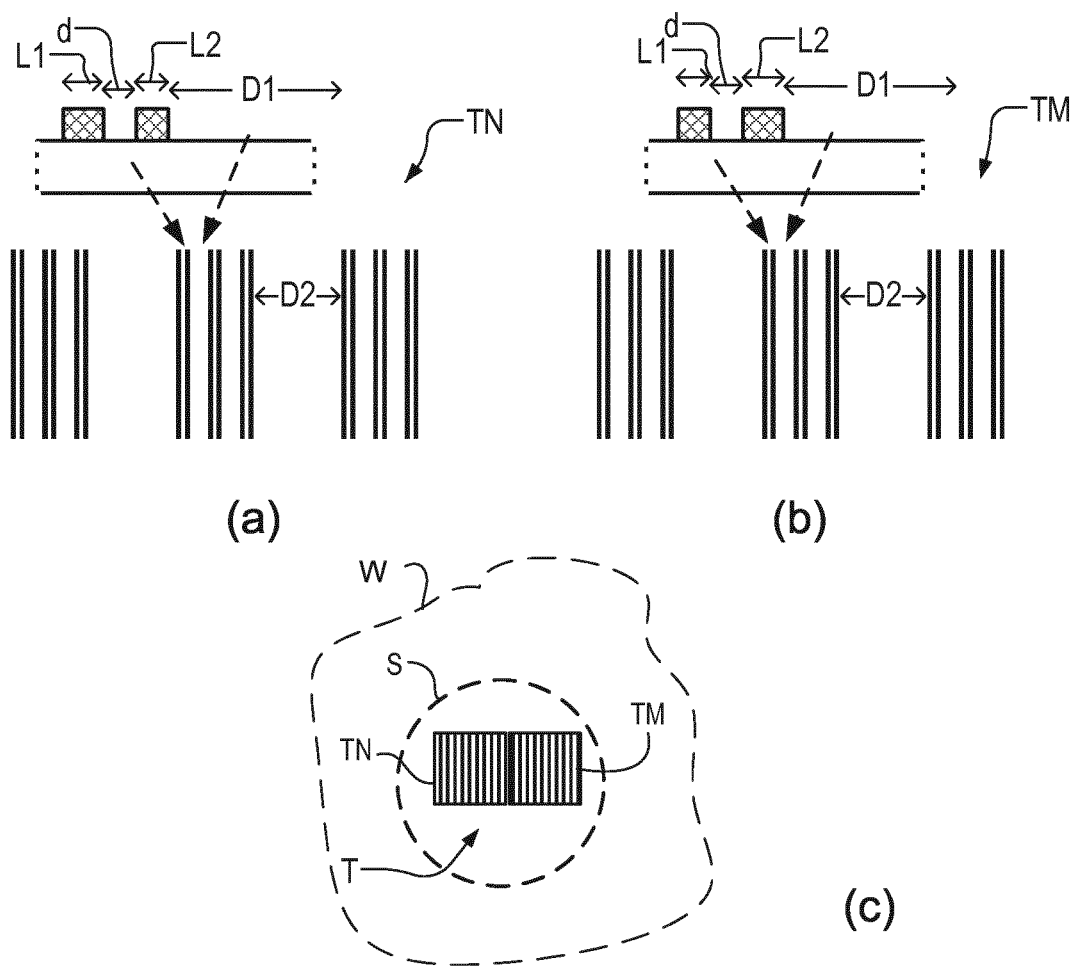
FIG. 14 (a) to (c) shows the formation of a composite focus metrology target using a pair of biased focus metrology patterns of the type shown in FIG. 11 (b), for use in an alternative embodiment of the second aspect of the invention.

Referring now to FIG. 14, in some embodiments, two or more similar focus metrology patterns are printed in the same step. These patterns are "biased", meaning that they are designed with a known asymmetry value built in, even when printed with zero focus error. FIGS. 14 (a) and (b) show a complementary pair of focus metrology patterns TN ('normal') and TM ('mirror'). These patterns have asymmetry introduced by making the features 1122 and 1124 in each pair unequal in dimension. In other words, dimensions L1 and L2 are unequal. In the 'normal' pattern TN, feature 1122 is broader than feature 1124 in each pair, (L1>L2). This inequality can be seen in the cross-sectional detail in FIG. 14 (a). Conversely, in the 'mirror' pattern TN, feature 1124 is broader than feature 1122 in each pair, (L1<L2). This inequality can be seen in the cross-sectional detail in FIG. 14 (b). These patterns TN and TM together form a composite focus metrology target T when printed side by side as shown in FIG. 14 (c). If they are small enough, they can be imaged simultaneously using radiation spot S in the dark field imaging mode of the inspection apparatus of FIG. 3. In other words, measurements of asymmetry in both of these focus metrology patterns can be taken by taking first and second images using the +1 and −1 order diffracted radiation collected by the apparatus.

Figure 15:
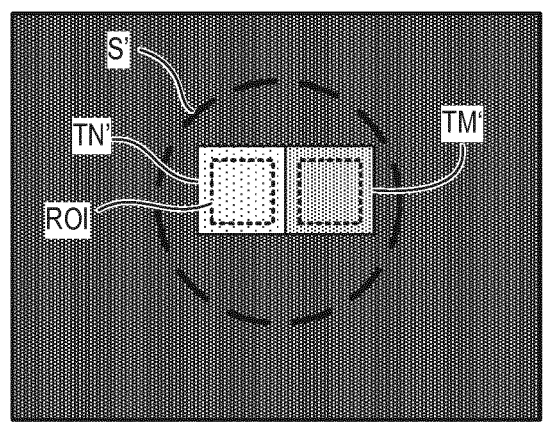
FIG. 15 shows a dark-field image of the metrology focus patterns of the target of FIG. 14, obtained using the apparatus of FIG. 3.

One such image is shown in FIG. 15. The dark rectangle represents the dark-field image as recorded on sensor 23 in the apparatus of FIG. 3, for example. A circle S' indicates the area of radiation spot S, imaged onto the detector. Brighter rectangles TN' and TM' represent the images of the complementary pair of focus metrology patterns TN and TM. The intensity of one diffraction order from each target can be measured by, for example, defining a region of interest ROI within each of the brighter rectangles, and averaging the pixel values. Repeating this for the opposite diffraction order allows asymmetry to be calculated. In an alternative measurement method using the prisms 21b shown in FIG. 3, then effectively both images of both patterns can be captured simultaneously.

In yet other embodiments, asymmetry of each focus metrology pattern TN, TM may be measured separately, for example using the pupil imaging branch of the inspection apparatus of FIG. 3, or a more general angle-resolved scatterometer. The opposite diffraction orders from one pattern are located in complementary regions of the pupil image, but only one pattern can be measured at a time.

As in the example of FIGS. 8 and 9, before, the composite focus metrology target may comprise more than one complementary pair of patterns. Thus pairs of patterns TNa/TMa and TNb/TMb may be provided with different design parameters, for example different periods and/or different spacings and/or different line widths.

It will be noted that each of the patterns shown in FIG. 14 is "pre-programmed" with an asymmetry, by suitable design of the patterning device (reticle) MA. Accordingly, compared with the example of FIG. 13, the asymmetry is present by design, regardless whether asymmetry is introduced by the projection system or other steps of the printing processes. Consequently the focus metrology patterns of FIG. 14 can be used to measure focus performance in a transmissive (e.g. DUV) lithographic apparatus, not only in a reflective (EUV) lithographic apparatus.

Whichever type of apparatus is used, the provision of focus metrology patterns side-by-side with known asymmetry "biases" allows measurement of focus error to be obtained with greater accuracy than would be possible with a single pattern. Other effects, such as coma, can be discriminated. The use of two or more biased targets allows differential measurements of asymmetry to be obtained. Combining these differential measurements with the knowledge of the programmed asymmetry and prior calibration allows a measurement of focus error to be derived, while canceling out other process-dependent variables.

The method relies on the fact that there is a known relation between the asymmetry (or other property) of the target and the focus error during exposure (printing). This relation should be a monotonically varying function (i.e. the sign of the asymmetry should be different for positive and negative focus). When this relation is known (for instance by computational means, and typically also with calibration), the actual focus position can be extracted from the asymmetry measurements on the two or more targets.

To achieve a reliable focus measurement in this way, the parameters of the design can be optimized based on mathematical simulation of the diffraction properties of the target(s) T, TN, TM, and/or on experimentation with different designs. To eliminate the effect of coma, for example, it is expected that mirrored targets in which the asymmetry is equal and opposite will be used. Unequal bias values could be envisaged, however, for particular circumstances.

Let us assume again that radiation with the wavelength 200 nm to 2000 nm is to be used in the inspection apparatus, for example radiation in the range 350 nm to 800 nm. The period P may be for example 450 nm or 600 nm. (If the inspection wavelength is less than 350 nm, for example in the range 150 nm to 300 nm, a shorter period P may be preferred.) The minimum dimension L1 and L2 of individual features in the focus metrology pattern may be for example less than 50 nanometers in the direction of periodicity. It may be similar to, or a little smaller than, the critical dimension CD of the smallest features in the product patterns. For example, the line widths of these features might be between 10 nm and 30 nm.

Examples of designs that may be considered having equal pairs of features like FIG. 13 have the pattern with dimensions L1/d/L2=15/20/15 nm. Examples of designs that may be considered having unequal pairs of features like FIG. 14 have the pattern with dimensions L1/d/L2=12/20/18 nm in the 'normal' pattern TN and L1/d/L2=18/20/12 nm in the mirror pattern TM. The spacings D1 and D2 may be selected to be large enough that the neighboring pairs of features 1122, 1124 are effectively isolated (as defined above). The parameters L1, L2, d, D, D1, D2, P can be defined in absolute terms and/or in relative terms as part of the design process. For example, an average feature dimension L can be defined first of all, and then the equality or inequality of the features within each pair can be defined by an asymmetry parameter $\Delta L$, such that L1=L+$\Delta L$ and L2=L−$\Delta L$. The asymmetry parameter $\Delta L$ can be defined in absolute or relative terms, for example as a percentage of L. A value $\Delta L$=L/10 for example would represent approximately 20% design asymmetry. The spacing d within a pair could also be defined in terms of L, or L1 or L2. The spacing d could be for example between one half and three times the average dimension L of the features.

The number N of pairs per period P is another parameter, which determines how much the diffraction signals are amplified by providing multiple pairs per period. To maximize the number of pairs per period P, the value D1 should be set as small as possible, while still keeping neighboring pairs substantially isolated. A ratio D1/(L+d+L) might be for example more than one but less than three, for example between 1½ and 2½. The spacing D2 between groups might be for example more than two times the spacing D1 between pairs within a group.

A parameter useful in designing such patterns may be referred to as "coverage", meaning the proportion of each period P that is occupied by the features that give rise to the desired diffraction signals. In the case of a simple line-space grating, coverage would simply be the linewidth (CD) divided by the period P. Diffractions signals tend to be strongest when this coverage ratio is around one half, for example in the range ¼ to ¾. In the case of the pairs and groups of pairs of lines illustrated in FIGS. 12-14, coverage can be defined by an "effective CD" CDeff which considers the pairs of lines and groups of pairs as a whole, rather than only the lines themselves. The effective CD in the examples of FIGS. 13 and 14 may for example be defined by everything within each period other than that large spaces D2. A formula using the notation of the drawings then becomes:

$$\text{CDeff}=N(L1+d+L2)+(N-1)D1$$

and a design rule can be defined such that the effective CD is approximately half the period. In terms of the ratio of CDeff to P, such a design rule may be expressed as:

$$¼<\text{CDeff}/P<¾.$$

Figure 16:
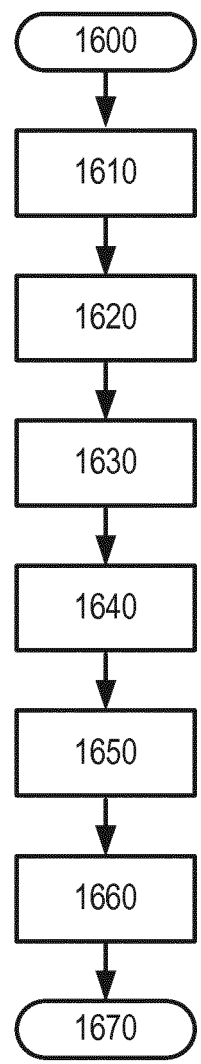
FIG. 16 is a flowchart of a method of monitoring focus according to an embodiment of the invention.

FIG. 16 shows the steps of a method for measuring focus performance of a lithographic process according to an exemplary embodiment. The method can be performed using any of the example focus metrology patterns described above and illustrated in the drawings. The steps are as follows, and are then described in greater detail thereafter:

1600—Start by defining a product design with metrology targets, and preparing a suitable set of patterning devices (reticles). In advance of production, make exposures with known focus-exposure variations and measure these to obtain one or more calibration curves. (This may involve an iterative loop of design, exposure and measurement steps.)

1610—Print one or more focus metrology patterns alongside product patterns on a substrate;

1620—Measure intensity of a portion of the diffraction spectrum of each focus metrology pattern using a suitable inspection apparatus (for example the +1 order is a suitable portion of the diffraction spectrum);

1630—Measure intensity of an opposite portion of the diffraction spectrum (for example, −1 order) of each focus metrology pattern using the inspection apparatus;

1640—Calculate measurements of asymmetry of one or more focus metrology patterns by comparing the intensities of the opposite diffraction orders;

1650—Using the asymmetry measurements, optionally with knowledge of programmed asymmetry between focus metrology patterns and/or other measurements such as actual overlay performance, calculate focus error at the time of printing the focus metrology pattern.

1660—Use the derived focus measurement in focus setting for exposures on subsequent substrates.

1670—End or repeat.

As already explained, step 1620 and step 1630 may be performed as a single step such that the opposite diffraction orders of a focus metrology pattern can be obtained in a single acquisition. In addition, where there are more than two targets being measured, all the targets may be measured in a single acquisition to obtain a corresponding number of measurement values.

Although the measurement steps are shown being made by a scatterometer, as a dedicated inspection apparatus, this may be a stand-alone apparatus or it may be integrated in the lithocell. Moreover, asymmetry measurements can be made without dedicated metrology apparatus, for example using suitable targets with the alignment sensors provided in the lithographic apparatus.

In another embodiment, based on the same method and target design, asymmetry measurements of the pairs of lines are not made by optical scatterometry (or not only by optical scatterometry), but by electron microscopy. L1 and L2 (hence) $\Delta CD_{LR}$ can be measured directly. The asymmetry L1-L2 can be normalized by dividing by the average or sum of L1+L2, to obtain a comparable measurement. Apart from the method of measuring asymmetry, the steps of the method can be the same as in FIG. 16. CD-SEM (scanning electron microscopy) is commonly used in semiconductor inspection. Other electron beam inspection tools are available, for example from Hermes Microvision (HMI), Taiwan ROC.

Calculation steps 1640 and 1650 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

Further embodiments are disclosed in the subsequent numbered clauses:

1. A method of measuring focus performance of a lithographic apparatus, the method comprising:
   (a) using the lithographic apparatus to print at least one focus metrology pattern on a substrate, the printed focus metrology pattern comprising at least a first periodic array of features,
   (b) using inspection radiation to measure asymmetry between opposite portions of a diffraction spectrum for the first periodic array in the printed focus metrology pattern; and
   (c) deriving a measurement of focus performance based at least in part on the asymmetry measured in step (b),
   wherein said first periodic array comprises a repeating arrangement of first features interleaved with second features, a minimum dimension of each first feature being close to but not less than a resolution limit of the printing step (a), a maximum dimension of each second feature in the direction of periodicity being at least twice the minimum dimension of the first features;
   wherein each first feature is positioned between two adjacent second features such that a spacing in the direction of periodicity between the first feature and its nearest second feature is between one half and twice the minimum dimension of the first features.

2. A method as defined in clause 1 wherein each first feature in the periodic array has said minimum dimension in the direction of periodicity.

3. A method as defined in clause 1 wherein each first feature in the periodic array has said minimum dimension in a direction transverse to the direction of periodicity.

4. A method as defined in any of clauses 1 to 3 wherein each second feature in the periodic array further includes sub-features having minimum dimensions close to but not less than a resolution limit of the printing step in a direction transverse to said direction of periodicity.

5. A method as defined in any preceding clause wherein the printed focus metrology pattern comprises at least first and second periodic arrays of features, each periodic array of features having a form as specified in said preceding clause, wherein there is a programmed asymmetry within each periodic array, the asymmetry of the second periodic array being opposite to that of the first periodic array, and wherein step (b) includes measuring asymmetry of each of the first and second periodic arrays and step (c) determines said measure of focus performance by combining the asymmetries measured for the periodic arrays.

6. A method as defined in clause 5 wherein said sub-features are arranged such that each second feature is asymmetric within regard to the direction of periodicity, and wherein the asymmetry of each second feature in the second periodic array of features is opposite to that in the first periodic array of features.

7. A method as defined in any of clauses 1 to 6 wherein the spacing of each first feature between two adjacent second features is unequal in the direction of periodicity, and wherein the unequal spacing of the first features between the adjacent second features in the second periodic array of features is opposite to that in the first periodic array of features.

8. A method as defined in clause 7 wherein a distance between each first feature and one of said adjacent second features in said direction of periodicity is between one and two times the distance between the first feature and the other one of said adjacent second features.

9. A method as defined in any of clauses 1 to 8 wherein the measurement in step (b) is performed using radiation having a wavelength much longer than said minimum dimension of the first features.

10. A method as defined in clause 9 wherein the measurement in step (b) is performed using radiation having a wavelength longer than 150 nm while said minimum dimensions of the first features is less than 40 nm.

11. A method as defined in any of clauses 1 to 10 wherein the measurement in step (b) is performed using radiation having a wavelength longer than 150 nm while a wavelength of radiation used by the lithographic apparatus to print the said focus metrology pattern is less than 20 nm.

12. A method as defined in any of clauses 1 to 11 wherein the period of each of said periodic arrays of features in said focus metrology pattern is greater than 350 nm.

13. A method of measuring focus performance of a lithographic apparatus, the method comprising:
   (a) using the lithographic apparatus to print at least one focus metrology pattern on a substrate, the printed focus metrology pattern comprising an array of features that is periodic in at least one direction;
   (b) measuring a property of the printed focus metrology pattern; and
   (c) deriving a measurement of focus performance from the measurement of said property,
   wherein the focus metrology pattern comprises at least a first periodic array of features, a dimension of each feature being close to but not less than a resolution limit of the printing step (a),
   wherein said features are arranged in pairs and a spacing between adjacent pairs of features within the focus metrology pattern in the direction of periodicity is much greater than both the dimension of each first feature and the spacing between first features within a pair.

14. A method as defined in clause 13 wherein the focus metrology pattern comprises a periodic array of groups of pairs of features, and wherein a spacing between adjacent groups of pairs of features within the focus metrology pattern in the direction of periodicity is much greater than both the dimension of each feature and the spacing between features within a pair.

15. A method as defined in clause 13 or 15 wherein the dimensions of the features within each pair and the dimension of the spacing between the features within each pair are of the same order of magnitude, in the direction of periodicity.

16. A method as defined in clause 15 wherein the dimension of the spacing between the features within each pair is between one half and two times the average dimension of the features within each pair, in the direction of periodicity.

17. A method as defined in clause 16 wherein the dimension of the spacing between the features within each pair is between $2/3$ and $1\frac{1}{2}$ times the average dimension of the features within each pair, in the direction of periodicity.

18. A method as defined in clause 15, 16 or 17 wherein the dimension of the spacing between the first features within each pair is between one and two times the minimum dimension of the features within each pair, in the direction of periodicity.

19. A method as defined in any of clauses 13 to 18 wherein the focus metrology pattern is defined by a patterning device and the printing in step (a) projects an image of the patterning device with patterning radiation incident on the patterning device at an oblique angle.

20. A method as defined in any of clauses 13 to 19 wherein the focus metrology pattern further comprises at least a second periodic array of pairs of features, the second periodic array having the same form as the first periodic array except that there is a programmed difference in dimension between the features within each pair in each array, and said programmed difference opposite between the first periodic array and the second periodic array.

21. A method as defined in clause 20 wherein the step (b) comprising measuring said property of the printed focus metrology pattern separately for the first and second periodic arrays pairs of features, and wherein in step (c) the measurement of focus performance is obtained by combining the measurements of said property for at least the first and second periodic arrays.

22. A method as defined in any of clauses 13 to 21 wherein the property measured in step (b) is asymmetry.

23. A method as defined in clause 22 wherein the asymmetry is measured by measuring asymmetry in a diffraction spectrum of the or each periodic array in the printed focus metrology pattern.

24. A method as defined in any of clauses 13 to 23 wherein the measurement in step (b) is performed using radiation having a wavelength much longer than the dimensions of the features within the pairs of features in said focus metrology pattern in the direction of periodicity.

25. A method as defined in clause 24 wherein the measurement in step (b) is performed using radiation having a wavelength longer than 150 nm while the dimensions of the features within pairs of features in said focus metrology pattern are less than 40 nm.

26. A method as defined in any of clauses 13 to 25 wherein the measurement in step (b) is performed using radiation having a wavelength longer than 150 nm while a wavelength of radiation used by the lithographic apparatus to print the said focus metrology pattern is less than 20 nm.

27. A method as defined in any of clauses 13 to 21 wherein the measurement in step (b) is performed using electron microscopy.

28. A method as defined in any of clauses 13 to 27 wherein the period of the or each periodic array of pairs of features in said focus metrology pattern is greater than 350 nm.

29. A patterning device for use in a lithographic apparatus, the patterning device comprising reflective and non-reflective portions to define features of one or more device patterns and one or more metrology patterns, the metrology patterns including at least one focus metrology pattern, the focus metrology pattern comprising a at least a first periodic array of features, wherein said first periodic array comprises a repeating arrangement of first features interleaved with second features, a minimum dimension of each first feature being close to but not less than a resolution limit of the lithographic apparatus, a maximum dimension of each second feature in the direction of periodicity being at least twice the minimum dimension of the first features;
wherein each first feature is positioned between two adjacent second features such that a spacing in the direction of periodicity between the first feature and its nearest second feature is between one half and twice the minimum dimension of the first features.

30. A patterning device as defined in clause 28 wherein the focus metrology pattern comprises at least first and second periodic arrays of features, each periodic array of features having a form as specified in clause 29, wherein there is a programmed asymmetry within each periodic array, the asymmetry of the second periodic array being opposite to that of the first periodic array.

31. A patterning device for use in a lithographic apparatus, the patterning device comprising reflective and non-reflective portions to define features of one or more device patterns and one or more metrology patterns, the metrology patterns including at least one focus metrology pattern, wherein the focus metrology pattern comprises at least a first periodic array of features, a dimension of each feature being close to but not less than a resolution limit of the lithographic apparatus, wherein said features are arranged in pairs and a spacing between adjacent pairs of features within the focus metrology pattern in the direction of periodicity is much greater than both the dimension of each first feature and the spacing between first features within a pair.

32. A patterning device as defined in clause 31 wherein the focus metrology pattern further comprises at least a second periodic array of pairs of features, the second periodic array having the same form as the first periodic array except that there is a programmed difference in dimension between the features within each pair in each array, and said programmed difference opposite between the first periodic array and the second periodic array.

33. A patterning device as defined in any of clauses 29 to 32 wherein said reflective portions are adapted to reflect a wavelength of radiation used in the lithographic apparatus that is shorter than 20 nanometers and wherein each first feature has a minimum dimension less than 40 nanometers in the direction of periodicity, when printed by said lithographic apparatus.

34. A metrology apparatus for measuring a parameter of a lithographic process, the metrology apparatus being operable to perform steps (b) and (c) of the method of any of clauses 1 to 28

35. A lithographic system comprising:
a lithographic apparatus comprising:
an illumination optical system arranged to illuminate a reflective patterning device;
a projection optical system arranged to project an image of the patterning device onto a substrate; and
a metrology apparatus according to clause 34
wherein the lithographic apparatus is arranged to use the measurement of focus performance derived by the metrology apparatus when applying the pattern to further substrates.

36. A computer program comprising processor readable instructions which, when run on suitable processor controlled apparatus, cause the processor controlled apparatus to perform steps (b) and/or (c) the method of any of clauses 1 to 28.

37. A method of manufacturing devices wherein a device pattern is applied to a series of substrates using a lithographic process, the method including:

using the method of any of clauses 1 to 28 to measure focus performance of the lithographic process, and controlling the lithographic process for later substrates in accordance with the measured focus performance.

CONCLUSION

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures including and focus metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

The substrates on which these metrology patterns are formed may be production wafers or experimental wafers in product development. They may also be dedicated metrology wafers, for example monitor wafers which are processed intermittently as part of an advance process control (APC) mechanism.

In association with the physical grating structures defining the focus metrology patterns as realized on substrates and patterning devices, an embodiment may include a computer program containing one or more sequences of machine-readable instructions describing a method of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method of measuring focus performance of a lithographic apparatus, the method comprising:
(a) using the lithographic apparatus to print at least one focus metrology pattern on a substrate, the printed focus metrology pattern comprising at least a first periodic array of features;
(b) using inspection radiation to measure asymmetry between opposite portions of a diffraction spectrum for the first periodic array in the printed focus metrology pattern; and
(c) deriving a measurement of focus performance based at least in part on the asymmetry measured in step (b),
wherein the first periodic array comprises a repeating arrangement of first features interleaved with second features, a minimum dimension of each first feature being close to but not less than a resolution limit of the printing step (a), a maximum dimension of each second feature in the direction of periodicity being at least twice the minimum dimension of the first features;
wherein each first feature is positioned between two adjacent second features such that a spacing in the direction of periodicity between the first feature and its nearest second feature is between one half and twice the minimum dimension of the first features.

2. The method of claim 1, wherein each first feature in the first periodic array has the minimum dimension in the direction of periodicity or wherein each first feature in the first periodic array has the minimum dimension in a direction transverse to the direction of periodicity.

3. The method of claim 1, wherein each second feature in the first periodic array further includes sub-features having minimum dimensions close to but not less than a resolution limit of the printing step in a direction transverse to the direction of periodicity.

4. The method of claim 1, wherein the printed focus metrology pattern comprises at least first and second periodic arrays of features, wherein there is a programmed asymmetry within each periodic array, the asymmetry of the second periodic array being opposite to that of the first periodic array, and wherein step (b) includes measuring asymmetry of each of the first and second periodic arrays and step (c) determines the measure of focus performance by combining the asymmetries measured for the periodic arrays; and wherein the sub-features are arranged such that each second feature is asymmetric with regard to the direction of periodicity, and wherein the asymmetry of each second feature in the second periodic array of features is opposite to that in the first periodic array of features.

5. The method of claim 4, wherein the spacing of each first feature between two adjacent second features is unequal in the direction of periodicity, and wherein the unequal spacing of the first features between the adjacent second features in the second periodic array of features is opposite to that in the first periodic array of features, and wherein, a distance between each first feature and one of the adjacent second features in the direction of periodicity is between one and two times the distance between the first feature and the other one of the adjacent second features.

6. The method of claim 1, wherein the measurement in step (b) is performed using radiation having a wavelength longer than 150 nm, while the minimum dimensions of the first feature is less than 40 nm.

7. The method of claim 1, wherein the measurement in step (b) is performed using radiation having a wavelength longer than 150 nm while a wavelength of radiation used by the lithographic apparatus to print the focus metrology pattern is less than 20 nm.

8. The method of claim 1, wherein the period of each of the periodic arrays of features in the focus metrology pattern is greater than 350 nm.

9. A method of manufacturing devices wherein a device pattern is applied to a series of substrates using a lithographic process, the method including:
using the method of claim 1 to measure focus performance of the lithographic process, and
controlling the lithographic process for later substrates in accordance with the measured focus performance.

10. A method of measuring focus performance of a lithographic apparatus, the method comprising:
(a) using the lithographic apparatus to print at least one focus metrology pattern on a substrate, the printed focus metrology pattern comprising an array of features that is periodic in at least one direction;
(b) measuring a property of the printed focus metrology pattern; and
(c) deriving a measurement of focus performance from the measurement of the property,
wherein the focus metrology pattern comprises at least a first periodic array of features, a dimension of each feature being close to but not less than a resolution limit of the printing step (a),
wherein the first periodic array of features are arranged in pairs and a spacing between adjacent pairs of features within the focus metrology pattern in the direction of periodicity is greater than both the dimension of each feature and the spacing between features within a pair, and
wherein each pair comprises two features of unequal width.

11. The method of claim 10, wherein the focus metrology pattern comprises a periodic array of groups of pairs of features, and wherein a spacing between adjacent groups of pairs of features within the focus metrology pattern in the direction of periodicity is greater than both the dimension of each feature and the spacing between features within a pair.

12. The method of claim 10, wherein the dimensions of the features within each pair and the dimension of the spacing between the features within each pair are of the same order of magnitude, in the direction of periodicity.

13. The method of claim 10, wherein the dimension of the spacing between the features within each pair is between one half and two times the average dimension of the features within each pair, in the direction of periodicity.

14. A patterning device for use in a lithographic apparatus, the patterning device comprising:
reflective and non-reflective portions to define features of one or more device patterns and one or more metrology patterns, the metrology patterns including at least one focus metrology pattern, the focus metrology pattern comprising at least a first periodic array of features,
wherein the first periodic array comprises a repeating arrangement of first features interleaved with second features, a minimum dimension of each first feature being close to but not less than a resolution limit of the lithographic apparatus, a maximum dimension of each second feature in the direction of periodicity being at least twice the minimum dimension of the first features;
wherein each first feature is positioned between two adjacent second features such that a spacing in the direction of periodicity between the first feature and its nearest second feature is between one half and twice the minimum dimension of the first features.

15. A patterning device for use in a lithographic apparatus, the patterning device comprising:
reflective and non-reflective portions to define features of one or more device patterns and one or more metrology patterns, the metrology patterns including at least one focus metrology pattern,
wherein the focus metrology pattern comprises at least a first periodic array of features, a dimension of each feature being close to but not less than a resolution limit of the lithographic apparatus,
wherein the features are arranged in pairs and a spacing between adjacent pairs of features within the focus metrology pattern in the direction of periodicity is greater than both the dimension of each feature and the spacing between features within a pair, and
wherein each pair comprises two features of unequal width.

16. A metrology apparatus for measuring a parameter of a lithographic process that printed at least one focus metrology pattern on a substrate, the printed focus metrology pattern comprising at least a first periodic array of features, the metrology apparatus being operable to perform a method of measuring focus performance of a lithographic apparatus, the method comprising:
(a) using inspection radiation to measure asymmetry between opposite portions of a diffraction spectrum for the first periodic array in the printed focus metrology pattern; and
(b) deriving a measurement of focus performance based at least in part on the asymmetry measured in step (a),
wherein the first periodic array comprises a repeating arrangement of first features interleaved with second features, a minimum dimension of each first feature being close to but not less than a resolution limit of the lithographic process, a maximum dimension of each second feature in the direction of periodicity being at least twice the minimum dimension of the first features;
wherein each first feature is positioned between two adjacent second features such that a spacing in the direction of periodicity between the first feature and its nearest second feature is between one half and twice the minimum dimension of the first features.

17. A lithographic system comprising:
a lithographic apparatus comprising:
an illumination optical system arranged to illuminate a reflective patterning device;
a projection optical system arranged to project an image of the patterning device onto a substrate; and
a metrology apparatus according to claim 16;
wherein the lithographic apparatus is arranged to use the measurement of focus performance derived by the metrology apparatus when applying the pattern to further substrates.

* * * * *